US008614977B2

(12) United States Patent
Wu et al.

(10) Patent No.: US 8,614,977 B2
(45) Date of Patent: Dec. 24, 2013

(54) METHOD AND APPARATUS FOR PARALLEL DE-INTERLEAVING OF LTE INTERLEAVED DATA

(75) Inventors: Wenqing Wu, San Diego, CA (US);
Hanfang Pan, San Diego, CA (US);
Michael A. Howard, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 182 days.

(21) Appl. No.: 13/103,912

(22) Filed: May 9, 2011

(65) Prior Publication Data

US 2011/0280185 A1 Nov. 17, 2011

Related U.S. Application Data

(60) Provisional application No. 61/333,573, filed on May 11, 2010.

(51) Int. Cl.
*H04W 4/00* (2009.01)

(52) U.S. Cl.
USPC .......................................................... 370/328

(58) Field of Classification Search
None
See application file for complete search history.

(56) References Cited

U.S. PATENT DOCUMENTS

| | | | |
|---|---|---|---|
| 7,200,181 B2 | 4/2007 | Kim et al. | |
| 7,440,392 B2 | 10/2008 | Hwang et al. | |
| 2002/0114401 A1* | 8/2002 | Kim et al. | 375/262 |
| 2003/0021240 A1* | 1/2003 | Moon et al. | 370/320 |
| 2004/0071172 A1* | 4/2004 | Beale | 370/537 |
| 2005/0111376 A1* | 5/2005 | Raghothaman et al. | 370/252 |
| 2005/0123236 A1* | 6/2005 | Ko et al. | 385/24 |
| 2005/0180332 A1 | 8/2005 | Kim et al. | |
| 2005/0204251 A1* | 9/2005 | Moon et al. | 714/748 |
| 2008/0098281 A1* | 4/2008 | Dimou | 714/768 |
| 2008/0267122 A1* | 10/2008 | Han et al. | 370/329 |
| 2009/0132893 A1* | 5/2009 | Miyazaki et al. | 714/776 |
| 2010/0290371 A1* | 11/2010 | Beale | 370/280 |
| 2011/0145670 A1* | 6/2011 | Fan et al. | 714/748 |
| 2011/0249569 A1* | 10/2011 | Mashino et al. | 370/242 |
| 2012/0051271 A1* | 3/2012 | Beale | 370/280 |

FOREIGN PATENT DOCUMENTS

EP 2006082923 10/2007

OTHER PUBLICATIONS

Anonymous: "3GPP TS 27.002:V9.0.0, 3rd Generation Partnership Project; Technical Specification Group Core Network; Terminal Adaptation Functions (TAF) for services using asynchronous bearer capabilities (Release 9)", Dec. 2009, XP002652581, Retrieved from the Internet: URL: http://www.quintillion.co.jp/3GPP/Specs/27002-900.pdf [retrieved on Jul. 22, 2011] the whole document.
Clark Cain, "Error-Correction Coding for Digital Communications", 1990, Plenum Press, XP002652553, pp. 345-352, section 8.3.2; the whole document.

(Continued)

*Primary Examiner* — Otis L Thompson, Jr.
(74) *Attorney, Agent, or Firm* — Kam T. Tam

(57) ABSTRACT

A wireless communication signal in Long Term Evolution (LTE) may be interleaved in a manner which permits a partitioning of a received inter-column bit-reversed interleaved code block for improved de-interleaving. The code block may be divided into equal subportions which may be simultaneously de-interleaved both forward and backward, and in parallel with other subportions. An even number of subportions may be provided. Dividing a received code block in this manner may improve de-interleaving performance.

18 Claims, 15 Drawing Sheets

(56) References Cited

OTHER PUBLICATIONS

"Digital cellular telecommunications system (Phase 2+); Universal Mobile Telecommunications System (UMTS) ; LTE; E-UTRA, UTRA and GSM/EDGE ; Multi-Standard Radio (MSR) Base Station (BS) radio transmission and reception (3GPP TS 37.104 version 9.0.0 Release 9)" Technical Specification, European Telecommunications Standards Institute (ETSI), 650, Route Des Lucioles ; F-06921 Sophia-Antipolis ; France, vol. 3GPP RAN 4, No. V9.0.0, Feb. 1, 2010, XP014046954, the whole document.
International Search Report and Written Opinion—PCT/US2011/035978—ISA/EPO—Aug. 5, 2011.
Wellig et al., "Energy- and Area-Efficient Deinterleaving Architecture for High-Throughput Wireless Applications", 2004, pp. 218-227, Springer-Verlag Berlin Heidelberg.

* cited by examiner

FIG. 5 Interleaving Process for S and P1 sequences

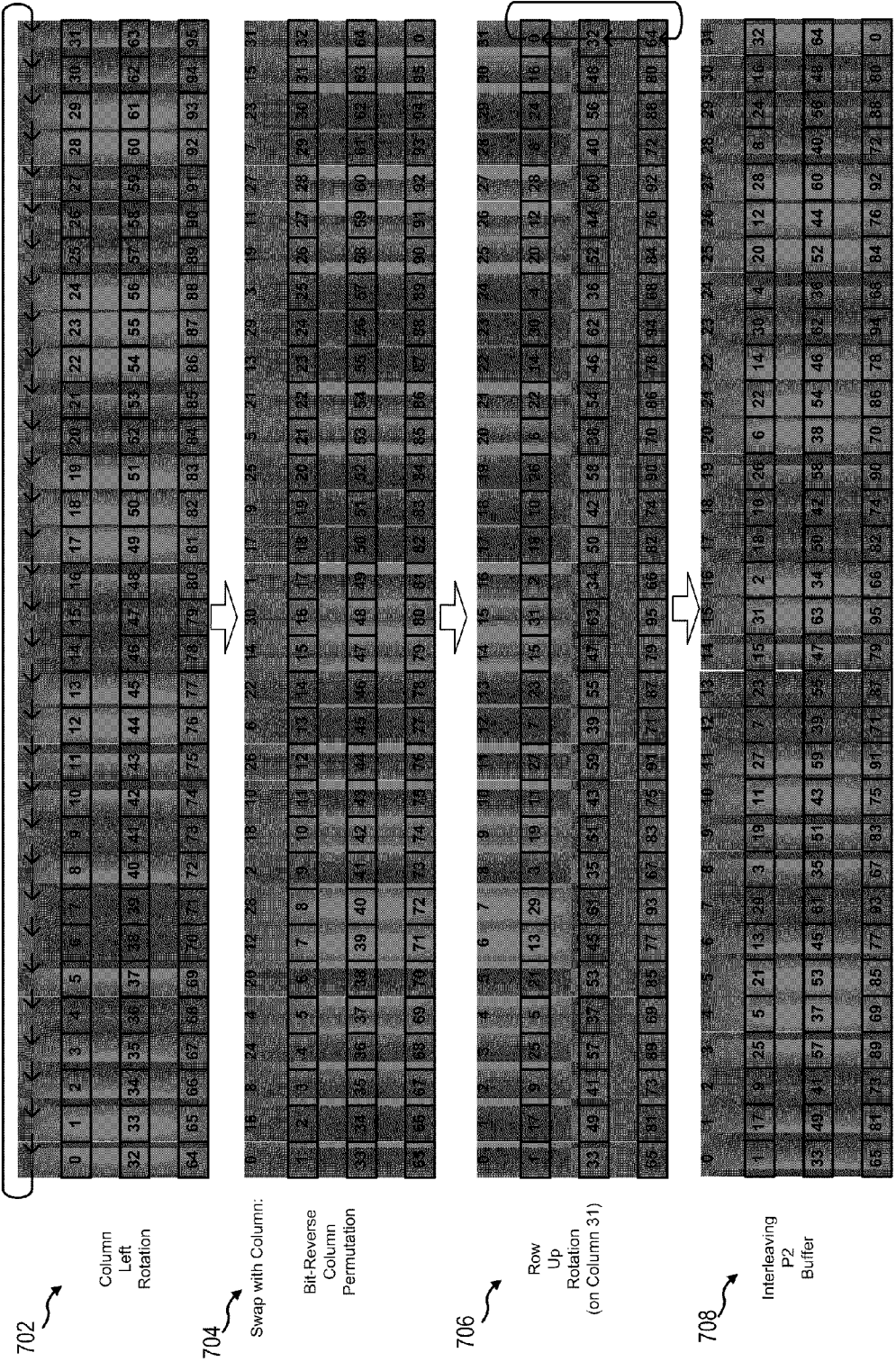
FIG. 7 Equivalent 3-step Interleaving Process for P2 Sequences

Dummy Bit Pruned Rate Matching Circular Buffer for Code Block of Size 8k

METHOD AND APPARATUS FOR PARALLEL DE-INTERLEAVING OF LTE INTERLEAVED DATA

CROSS REFERENCE TO RELATED APPLICATION

This application claims the benefit of U.S. provisional patent application No. 61/333,573, entitled, "PARALLEL DEINTERLEAVING OF LTE INTERLEAVED DATA", filed May 11, 2010, the disclosure of which is expressly incorporated herein by reference in its entirety.

BACKGROUND

1. Field

The present disclosure relates generally to communication systems, and more particularly, to parallel de-interleaving of LTE interleaved data.

2. Background

Wireless communication networks are widely deployed to provide various communication services such as voice, video, packet data, messaging, broadcast, etc. These wireless networks may be multiple-access networks capable of supporting multiple users by sharing the available network resources. Examples of such multiple-access networks include Code Division Multiple Access (CDMA) networks, Time Division Multiple Access (TDMA) networks, Frequency Division Multiple Access (FDMA) networks, Orthogonal FDMA (OFDMA) networks, and Single-Carrier FDMA (SC-FDMA) networks.

A wireless communication network may include a number of base stations that can support communication for a number of user equipments (UEs). A UE may communicate with a base station via the downlink and uplink. The downlink (or forward link) refers to the communication link from the base station to the UE, and the uplink (or reverse link) refers to the communication link from the UE to the base station.

A base station may transmit data and control information on the downlink to a UE and/or may receive data and control information on the uplink from the UE. On the downlink, a transmission from the base station may encounter interference due to transmissions from neighbor base stations or from other wireless radio frequency (RF) transmitters. On the uplink, a transmission from the UE may encounter interference from uplink transmissions of other UEs communicating with the neighbor base stations or from other wireless RF transmitters. This interference may degrade performance on both the downlink and uplink.

As the demand for mobile broadband access continues to increase, the possibilities of interference and congested networks grows with more UEs accessing the long-range wireless communication networks and more short-range wireless systems being deployed in communities. Research and development continue to advance the UMTS technologies not only to meet the growing demand for mobile broadband access, but to advance and enhance the user experience with mobile communications.

SUMMARY

A method for wireless communication is offered. The method includes receiving an inter-column bit-reversed interleaved code block. The method also includes partitioning the received inter-column bit-reversed interleaved code block into variable portions. The partitioning enables de-interleaving of each portion independently from other portions. The method further includes de-interleaving the variable portions.

An apparatus for wireless communication is offered. The apparatus includes means for receiving an inter-column bit-reversed interleaved code block. The apparatus also includes means for partitioning the received inter-column bit-reversed interleaved code block into variable portions. The partitioning enables de-interleaving of each portion independently from other portions. The apparatus further includes means for de-interleaving the variable portions.

A computer program product for wireless communication is offered. The computer program product includes a non-transitory computer-readable medium having non-transitory program code recorded thereon. The program code includes program code to receive an inter-column bit-reversed interleaved code block. The program code also includes program code to partition the received inter-column bit-reversed interleaved code block into variable portions. The partitioning enables de-interleaving of each portion independently from other portions. The program code further includes program code to de-interleave the variable portions.

An apparatus for wireless communication is offered. The apparatus includes a memory and a processor(s) coupled to the memory. The processor(s) is configured to receive an inter-column bit-reversed interleaved code block. The processor(s) is also configured to partition the received inter-column bit-reversed interleaved code block into variable portions. The partitioning enables de-interleaving of each portion independently from other portions. The processor(s) is further configured to de-interleave the variable portions.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

The features, nature, and advantages of the present disclosure will become more apparent from the detailed description set forth below when taken in conjunction with the drawings in which like reference characters identify correspondingly throughout and wherein:

FIG. 5 illustrates S and P1 row-column matrix code blocks prior to and after bit-reverse column interleaving.

FIG. 7 illustrates P2 row-column matrix code blocks prior to and after bit-reverse column interleaving.

DETAILED DESCRIPTION

Figure 1:
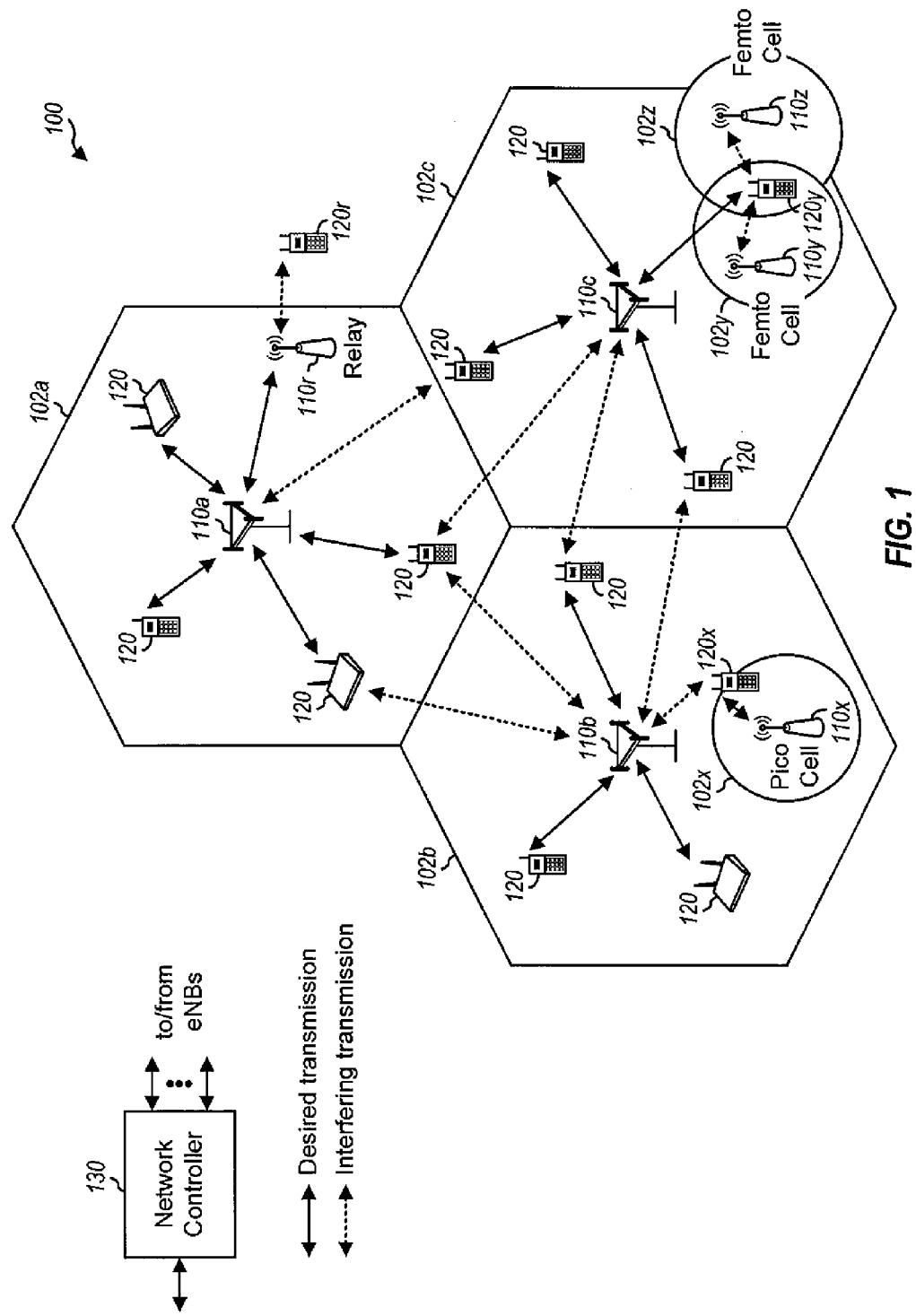
FIG. 1 is a block diagram conceptually illustrating an example of a mobile communication system.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

The techniques described herein may be used for various wireless communication networks such as Code Division Multiple Access (CDMA) networks, Time Division Multiple Access (TDMA) networks, Frequency Division Multiple Access (FDMA) networks, Orthogonal FDMA (OFDMA) networks, Single-Carrier FDMA (SC-FDMA) networks, etc. The terms "networks" and "systems" are often used interchangeably. A CDMA network may implement a radio technology such as Universal Terrestrial Radio Access (UTRA), CDMA2000, etc. UTRA includes Wideband-CDMA (W-CDMA) and Low Chip Rate (LCR). CDMA2000 covers IS-2000, IS-95 and IS-856 standards. A TDMA network may implement a radio technology such as Global System for Mobile Communications (GSM). An OFDMA network may implement a radio technology such as Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). Long Term Evolution (LTE) is an upcoming release of UMTS that uses E-UTRA. UTRA, E-UTRA, GSM, UMTS and LTE are described in documents from an organization named "3rd Generation Partnership Project" (3GPP). CDMA2000 is described in documents from an organization named "3rd Generation Partnership Project 2" (3GPP2). These various radio technologies and standards are known in the art. For clarity, certain aspects of the techniques are described below for LTE, and LTE terminology is used in much of the description below.

The techniques described herein may be used for various wireless communication networks such as CDMA, TDMA, FDMA, OFDMA, SC-FDMA and other networks. The terms "network" and "system" are often used interchangeably. A CDMA network may implement a radio technology, such as Universal Terrestrial Radio Access (UTRA), Telecommunications Industry Association's (TIA's) CDMA2000®, and the like. The UTRA technology includes Wideband CDMA (WCDMA) and other variants of CDMA. The CDMA2000® technology includes the IS-2000, IS-95 and IS-856 standards from the Electronics Industry Alliance (EIA) and TIA. A TDMA network may implement a radio technology, such as Global System for Mobile Communications (GSM). An OFDMA network may implement a radio technology, such as Evolved UTRA (E-UTRA), Ultra Mobile Broadband (UMB), IEEE 802.11 (Wi-Fi), IEEE 802.16 (WiMAX), IEEE 802.20, Flash-OFDMA, and the like. The UTRA and E-UTRA technologies are part of Universal Mobile Telecommunication System (UMTS). 3GPP Long Term Evolution (LTE) and LTE-Advanced (LTE-A) are newer releases of the UMTS that use E-UTRA. UTRA, E-UTRA, UMTS, LTE, LTE-A and GSM are described in documents from an organization called the "3rd Generation Partnership Project" (3GPP). CDMA2000® and UMB are described in documents from an organization called the "3rd Generation Partnership Project 2" (3GPP2). The techniques described herein may be used for the wireless networks and radio access technologies mentioned above, as well as other wireless networks and radio access technologies. For clarity, certain aspects of the techniques are described below for LTE or LTE-A (together referred to in the alternative as "LTE/-A") and use such LTE/-A terminology in much of the description below.

FIG. 1 shows a wireless communication network 100, which may be an LTE-A network. The wireless network 100 includes a number of evolved node Bs (eNodeBs) 110 and other network entities. An eNodeB may be a station that communicates with the UEs and may also be referred to as a base station, a node B, an access point, and the like. Each eNodeB 110 may provide communication coverage for a particular geographic area. In 3GPP, the term "cell" can refer to this particular geographic coverage area of an eNodeB and/or an eNodeB subsystem serving the coverage area, depending on the context in which the term is used.

An eNodeB may provide communication coverage for a macro cell, a pico cell, a femto cell, and/or other types of cell. A macro cell generally covers a relatively large geographic area (e.g., several kilometers in radius) and may allow unrestricted access by UEs with service subscriptions with the network provider. A pico cell would generally cover a relatively smaller geographic area and may allow unrestricted access by UEs with service subscriptions with the network provider. A femto cell would also generally cover a relatively small geographic area (e.g., a home) and, in addition to unrestricted access, may also provide restricted access by UEs having an association with the femto cell (e.g., UEs in a closed subscriber group (CSG), UEs for users in the home, and the like). An eNodeB for a macro cell may be referred to as a macro eNodeB. An eNodeB for a pico cell may be referred to as a pico eNodeB. And, an eNodeB for a femto cell may be referred to as a femto eNodeB or a home eNodeB. In the example shown in FIG. 1, the eNodeBs 110a, 110b and 110c are macro eNodeBs for the macro cells 102a, 102b and 102c, respectively. The eNodeB 110x is a pico eNodeB for a pico cell 102x. And, the eNodeBs 110y and 110z are femto eNodeBs for the femto cells 102y and 102z, respectively. An eNodeB may support one or multiple (e.g., two, three, four, and the like) cells.

The wireless network 100 may also include relay stations. A relay station is a station that receives a transmission of data and/or other information from an upstream station (e.g., an eNodeB, UE, etc.) and sends a transmission of the data and/or other information to a downstream station (e.g., a UE or an eNodeB). A relay station may also be a UE that relays transmissions for other UEs. In the example shown in FIG. 1, a relay station 110r may communicate with the eNodeB 110a and a UE 120r in order to facilitate communication between the eNodeB 110a and the UE 120r. A relay station may also be referred to as a relay eNodeB, a relay, etc.

The wireless network 100 may support synchronous or asynchronous operation. For synchronous operation, the eNodeBs may have similar frame timing, and transmissions from different eNodeBs may be approximately aligned in time. For asynchronous operation, the eNodeBs may have different frame timing, and transmissions from different eNodeBs may not be aligned in time. The techniques described herein may be used for either synchronous or asynchronous operations.

In one aspect, the wireless network 100 may support Frequency Division Duplex (FDD) or Time Division Duplex (TDD) modes of operation. The techniques described herein may be used for either FDD or TDD mode of operation.

A network controller 130 may couple to a set of eNodeBs 110 and provide coordination and control for these eNodeBs 110. The network controller 130 may communicate with the eNodeBs 110 via a backhaul. The eNodeBs 110 may also communicate with one another, e.g., directly or indirectly via a wireless backhaul or a wireline backhaul.

The UEs 120 are dispersed throughout the wireless network 100, and each UE may be stationary or mobile. A UE may also be referred to as a terminal, a mobile station, a subscriber unit, a station, or the like. A UE may be a cellular phone, a personal digital assistant (PDA), a wireless modem, a wireless communication device, a handheld device, a laptop computer, a cordless phone, a wireless local loop (WLL) station, a tablet, or the like. A UE may be able to communicate with macro eNodeBs, pico eNodeBs, femto eNodeBs, relays, and the like. In FIG. 1, a solid line with double arrows indicates desired transmissions between a UE and a serving eNodeB, which is an eNodeB designated to serve the UE on the downlink and/or uplink. A dashed line with double arrows indicates interfering transmissions between a UE and an eNodeB.

LTE utilizes orthogonal frequency division multiplexing (OFDM) on the downlink and single-carrier frequency division multiplexing (SC-FDM) on the uplink. OFDM and SC-FDM partition the system bandwidth into multiple (K) orthogonal subcarriers, which are also commonly referred to as tones, bins, or the like. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, the spacing of the subcarriers may be 15 kHz and the minimum resource allocation (called a 'resource block') may be 12 subcarriers (or 180 kHz). Consequently, the nominal FFT size may be equal to 128, 256, 512, 1024 or 2048 for a corresponding system bandwidth of 1.25, 2.5, 5, 10 or 20 megahertz (MHz), respectively. The system bandwidth may also be partitioned into sub-bands. For example, a sub-band may cover 1.08 MHz (i.e., 6 resource blocks), and there may be 1, 2, 4, 8 or 16 sub-bands for a corresponding system bandwidth of 1.25, 2.5, 5, 10 or 20 MHz, respectively.

Figure 2:
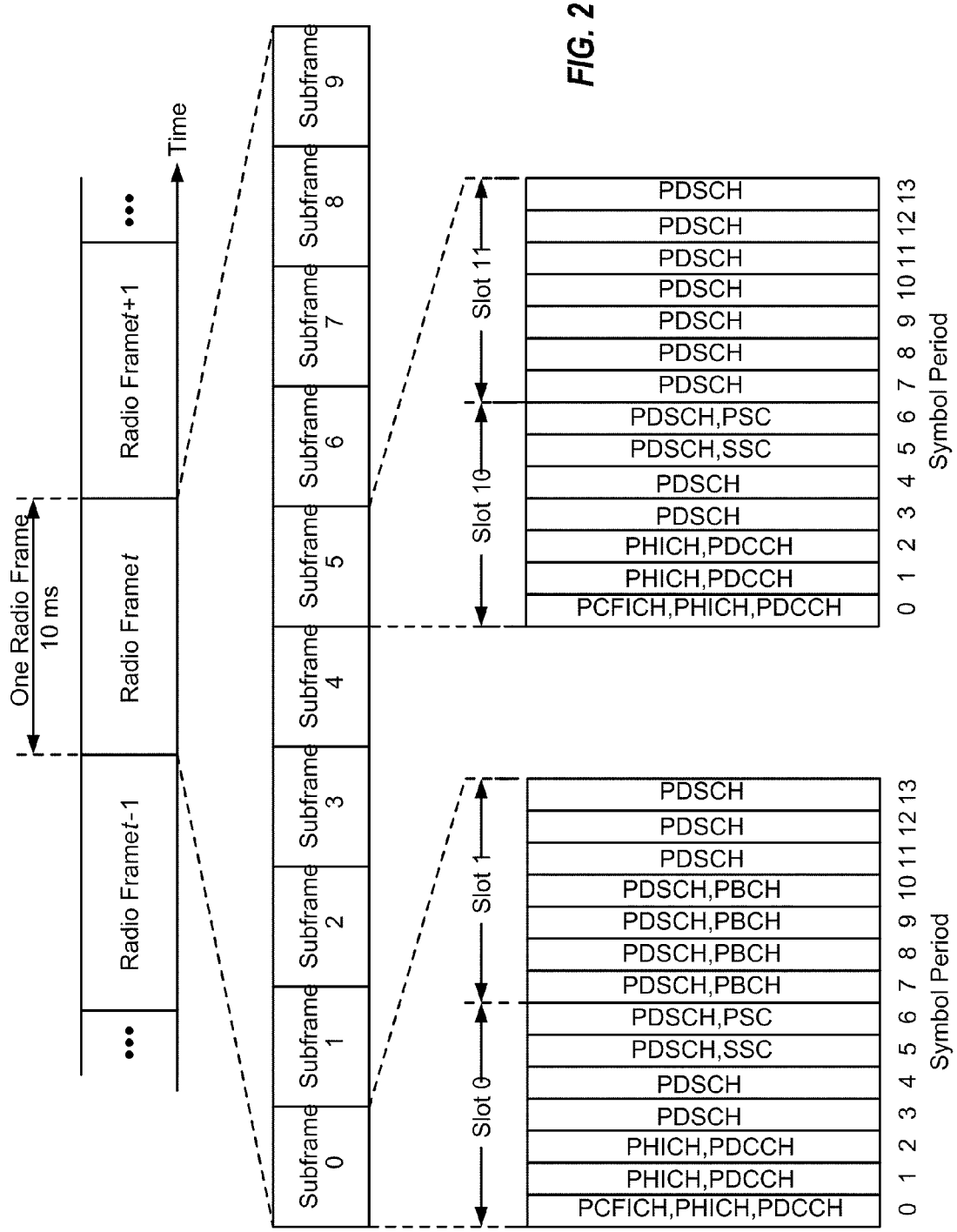
FIG. 2 is a block diagram conceptually illustrating an example of a downlink frame structure in a mobile communication system.

FIG. 2 shows a downlink FDD frame structure used in LTE. The transmission timeline for the downlink may be partitioned into units of radio frames. Each radio frame may have a predetermined duration (e.g., 10 milliseconds (ms)) and may be partitioned into 10 subframes with indices of 0 through 9. Each subframe may include two slots. Each radio frame may thus include 20 slots with indices of 0 through 19. Each slot may include L symbol periods, e.g., 7 symbol periods for a normal cyclic prefix (as shown in FIG. 2) or 6 symbol periods for an extended cyclic prefix. The 2L symbol periods in each subframe may be assigned indices of 0 through 2L−1. The available time frequency resources may be partitioned into resource blocks. Each resource block may cover N subcarriers (e.g., 12 subcarriers) in one slot.

In LTE, an eNodeB may send a primary synchronization signal (PSC or PSS) and a secondary synchronization signal (SSC or SSS) for each cell in the eNodeB. For FDD mode of operation, the primary and secondary synchronization signals may be sent in symbol periods 6 and 5, respectively, in each of subframes 0 and 5 of each radio frame with the normal cyclic prefix, as shown in FIG. 2. The synchronization signals may be used by UEs for cell detection and acquisition. For FDD mode of operation, the eNodeB may send a Physical Broadcast Channel (PBCH) in symbol periods 0 to 3 in slot 1 of subframe 0. The PBCH may carry certain system information.

The eNodeB may send a Physical Control Format Indicator Channel (PCFICH) in the first symbol period of each subframe, as seen in FIG. 2. The PCFICH may convey the number of symbol periods (M) used for control channels, where M may be equal to 1, 2 or 3 and may change from subframe to subframe. M may also be equal to 4 for a small system bandwidth, e.g., with less than 10 resource blocks. In the example shown in FIG. 2, M=3. The eNodeB may send a Physical HARQ Indicator Channel (PHICH) and a Physical Downlink Control Channel (PDCCH) in the first M symbol periods of each subframe. The PDCCH and PHICH are also included in the first three symbol periods in the example shown in FIG. 2. The PHICH may carry information to support hybrid automatic repeat request (HARQ). The PDCCH may carry information on uplink and downlink resource allocation for UEs and power control information for uplink channels. The eNodeB may send a Physical Downlink Shared Channel (PDSCH) in the remaining symbol periods of each subframe. The PDSCH may carry data for UEs scheduled for data transmission on the downlink.

The eNodeB may send the PSC, SSC and PBCH in the center 1.08 MHz of the system bandwidth used by the eNodeB. The eNodeB may send the PCFICH and PHICH across the entire system bandwidth in each symbol period in which these channels are sent. The eNodeB may send the PDCCH to groups of UEs in certain portions of the system bandwidth. The eNodeB may send the PDSCH to groups of UEs in specific portions of the system bandwidth. The eNodeB may send the PSC, SSC, PBCH, PCFICH and PHICH in a broadcast manner to all UEs, may send the PDCCH in a unicast manner to specific UEs, and may also send the PDSCH in a unicast manner to specific UEs.

A number of resource elements may be available in each symbol period. Each resource element may cover one subcarrier in one symbol period and may be used to send one modulation symbol, which may be a real or complex value. For symbols that are used for control channels, the resource elements not used for a reference signal in each symbol period may be arranged into resource element groups (REGs). Each REG may include four resource elements in one symbol period. The PCFICH may occupy four REGs, which may be spaced approximately equally across frequency, in symbol period 0. The PHICH may occupy three REGs, which may be spread across frequency, in one or more configurable symbol periods. For example, the three REGs for the PHICH may all belong in symbol period 0 or may be spread in symbol periods 0, 1 and 2. The PDCCH may occupy 9, 18, 36 or 72 REGs, which may be selected from the available REGs, in the first M symbol periods. Only certain combinations of REGs may be allowed for the PDCCH.

A UE may know the specific REGs used for the PHICH and the PCFICH. The UE may search different combinations of REGs for the PDCCH. The number of combinations to search is typically less than the number of allowed combinations for all UEs in the PDCCH. An eNodeB may send the PDCCH to the UE in any of the combinations that the UE will search.

Figure 3:
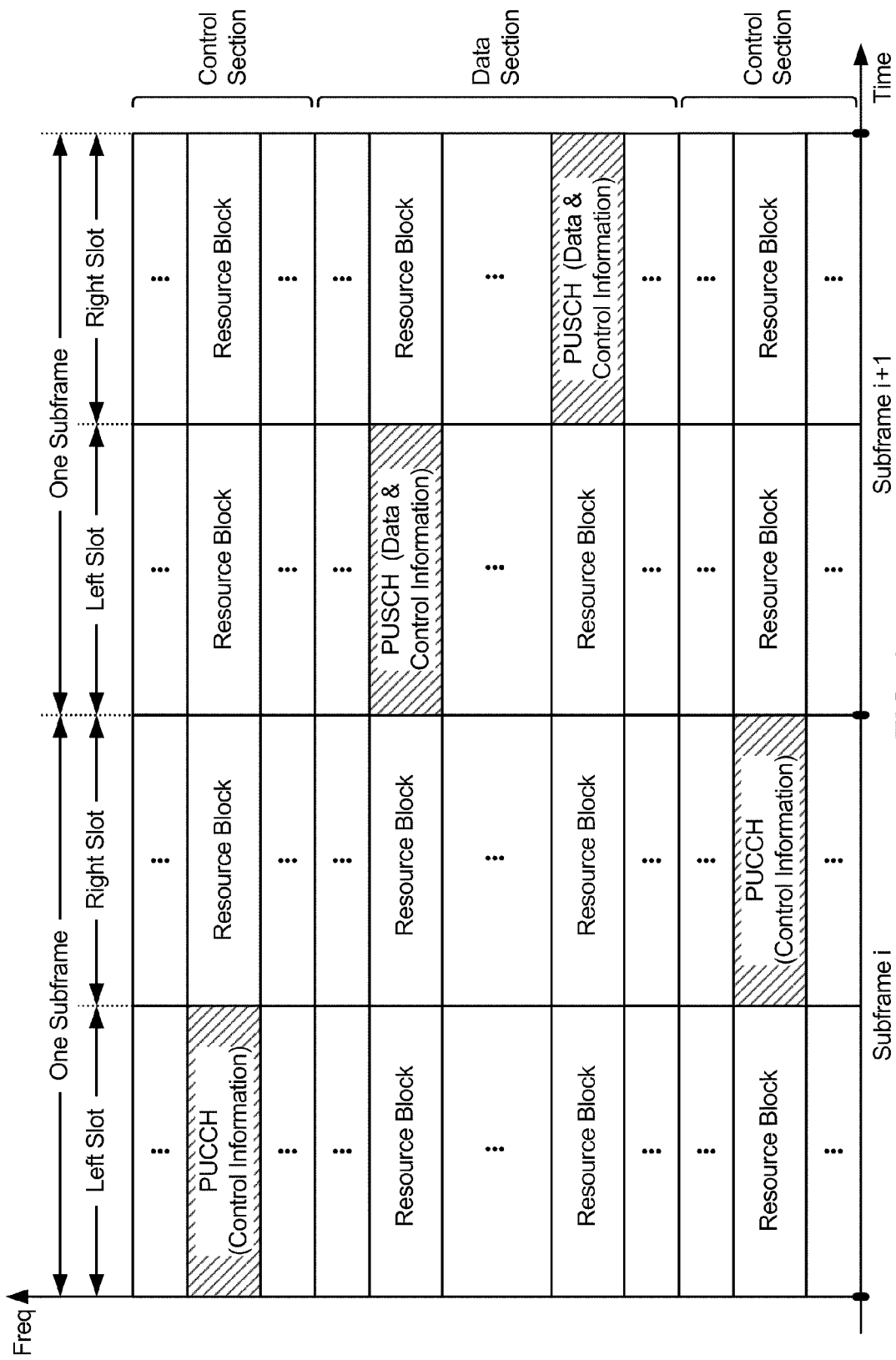
FIG. 3 is a block diagram conceptually illustrating an exemplary frame structure in uplink communications.

FIG. 3 is a block diagram conceptually illustrating an exemplary FDD and TDD (non-special subframe only) subframe structure in uplink long term evolution (LTE) communications. The available resource blocks (RBs) for the uplink may be partitioned into a data section and a control section. The control section may be formed at the two edges of the system bandwidth and may have a configurable size. The resource blocks in the control section may be assigned to UEs for transmission of control information. The data section may include all resource blocks not included in the control section. The design in FIG. 3 results in the data section including contiguous subcarriers, which may allow a single UE to be assigned all of the contiguous subcarriers in the data section.

A UE may be assigned resource blocks in the control section to transmit control information to an eNodeB. The UE may also be assigned resource blocks in the data section to transmit data to the eNode B. The UE may transmit control information in a Physical Uplink Control Channel (PUCCH) on the assigned resource blocks in the control section. The UE may transmit only data or both data and control information in a Physical Uplink Shared Channel (PUSCH) on the assigned resource blocks in the data section. An uplink transmission may span both slots of a subframe and may hop across frequency as shown in FIG. 3. According to one aspect, in relaxed single carrier operation, parallel channels may be transmitted on the UL resources. For example, a control and a data channel, parallel control channels, and parallel data channels may be transmitted by a UE.

Figure 4:
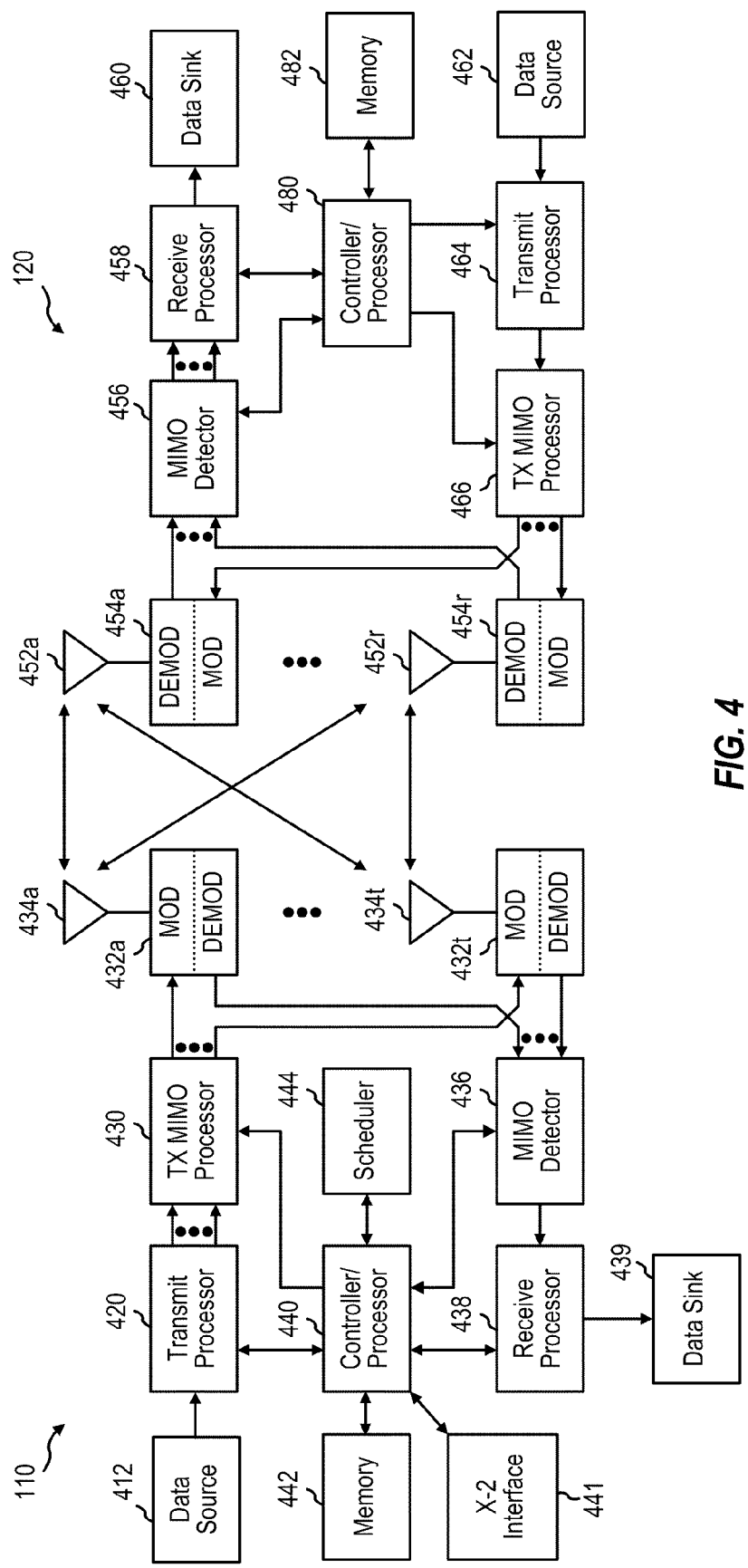
FIG. 4 is a block diagram conceptually illustrating a design of a base station/eNodeB and a UE configured according to one aspect of the present disclosure.

FIG. 4 shows a block diagram of a design of a base station/eNodeB 110 and a UE 120, which may be one of the base stations/eNodeBs and one of the UEs in FIG. 1. The base station 110 may be the macro eNodeB 110c in FIG. 1, and the UE 120 may be the UE 120y. The base station 110 may also be a base station of some other type. The base station 110 may be equipped with antennas 434a through 434t, and the UE 120 may be equipped with antennas 452a through 452r.

At the base station 110, a transmit processor 420 may receive data from a data source 412 and control information from a controller/processor 440. The control information may be for the PBCH, PCFICH, PHICH, PDCCH, etc. The data may be for the PDSCH, etc. The processor 420 may process (e.g., encode and symbol map) the data and control information to obtain data symbols and control symbols, respectively. The processor 420 may also generate reference symbols, e.g., for the PSS, SSS, and cell-specific reference signal. A transmit (TX) multiple-input multiple-output (MIMO) processor 430 may perform spatial processing (e.g., precoding) on the data symbols, the control symbols, and/or the reference symbols, if applicable, and may provide output symbol streams to the modulators (MODs) 432a through 432t. Each modulator 432 may process a respective output symbol stream (e.g., for OFDM, etc.) to obtain an output sample stream. Each modulator 432 may further process (e.g., convert to analog, amplify, filter, and upconvert) the output sample stream to obtain a downlink signal. Downlink signals from modulators 432a through 432t may be transmitted via the antennas 434a through 434t, respectively.

At the UE 120, the antennas 452a through 452r may receive the downlink signals from the base station 110 and may provide received signals to the demodulators (DEMODs) 454a through 454r, respectively. Each demodulator 454 may condition (e.g., filter, amplify, downconvert, and digitize) a respective received signal to obtain input samples. Each demodulator 454 may further process the input samples (e.g., for OFDM, etc.) to obtain received symbols. A MIMO detector 456 may obtain received symbols from all the demodulators 454a through 454r, perform MIMO detection on the received symbols if applicable, and provide detected symbols. A receive processor 458 may process (e.g., demodulate, deinterleave, and decode) the detected symbols, provide decoded data for the UE 120 to a data sink 460, and provide decoded control information to a controller/processor 480.

On the uplink, at the UE 120, a transmit processor 464 may receive and process data (e.g., for the PUSCH) from a data source 462 and control information (e.g., for the PUCCH) from the controller/processor 480. The processor 464 may also generate reference symbols for a reference signal. The symbols from the transmit processor 464 may be precoded by a TX MIMO processor 466 if applicable, further processed by the modulators 454a through 454r (e.g., for SC-FDM, etc.), and transmitted to the base station 110. At the base station 110, the uplink signals from the UE 120 may be received by the antennas 434, processed by the demodulators 432, detected by a MIMO detector 436 if applicable, and further processed by a receive processor 438 to obtain decoded data and control information sent by the UE 120. The processor 438 may provide the decoded data to a data sink 439 and the decoded control information to the controller/processor 440. The base station 110 can send messages to other base stations, for example, over an X2 interface 441.

The controllers/processors 440 and 480 may direct the operation at the base station 110 and the UE 120, respectively. The processor 440 and/or other processors and modules at the base station 110 may perform or direct the execution of various processes for the techniques described herein. The processor 480 and/or other processors and modules at the UE 120 may also perform or direct the execution of the functional blocks illustrated in use method flow chart FIG. 14, and/or other processes for the techniques described herein. The memories 442 and 482 may store data and program codes for the base station 110 and the UE 120, respectively. A scheduler 444 may schedule UEs for data transmission on the downlink and/or uplink.

Parallel Deinterleaving of LTE Interleaved Data

In wireless communication systems various techniques may be employed to increase the likelihood that wireless signals will be properly transmitted and received and that communications will not be interrupted. One such technique involves the reordering of data groups prior to transmission by a transmitting entity (such as a base station) and then eventually piecing the data back together by a receiving entity (such as a UE). The process of reordering the information prior to transmission is called interleaving. The process of putting the information back in order following reception is called de-interleaving. One benefit of interleaving is to reduce the impact of potential interference to the transmitted signal. Without interleaving, if a portion of a data transmission encounters interference (or other transmission errors) and is not received by the receiving entity, all the data lost will be located in one portion of the data signal. When too much data is lost from the same portion of a data signal it may be difficult for a UE to correct for the lost data, which may result in interruption of wireless communications. If a portion of an interleaved signal is lost prior to reception all the data lost will not necessarily be from the same group of data. That is, if portions of lost data are not contiguous it may be easier for the receiving entity (UE) to correct for the lost data and not interfere with wireless communications.

For example, if data bits 0-149 are transmitted in order and transmissions 30-34 are lost, the UE may have difficulty accounting for the five lost contiguous data bits (30, 31, 32, 33, and 34) and an interruption in communications may occur. However if the data bits 1-149 are interleaved prior to transmitting, they may be ordered such that sequential data bits are transmitted at different times from each other (for example transmissions 1-10 may be data bits 3, 22, 43, 59, 67, 75, 88, 99, 4, and 27). Thus, if transmissions 30-34 are lost, those transmission may correspond to non-sequential data bits (for example, 5, 20, 57, 81, 98). If the lost data bits are not sequential, the UE may be better able to correct for the lost data and avoid an interruption in communications.

For proper interleaving and de-interleaving the method for reordering data groups by the transmitter must be known to the receiver so that at the receiving end the transmissions may be properly reordered for further data processing.

Figure 5:
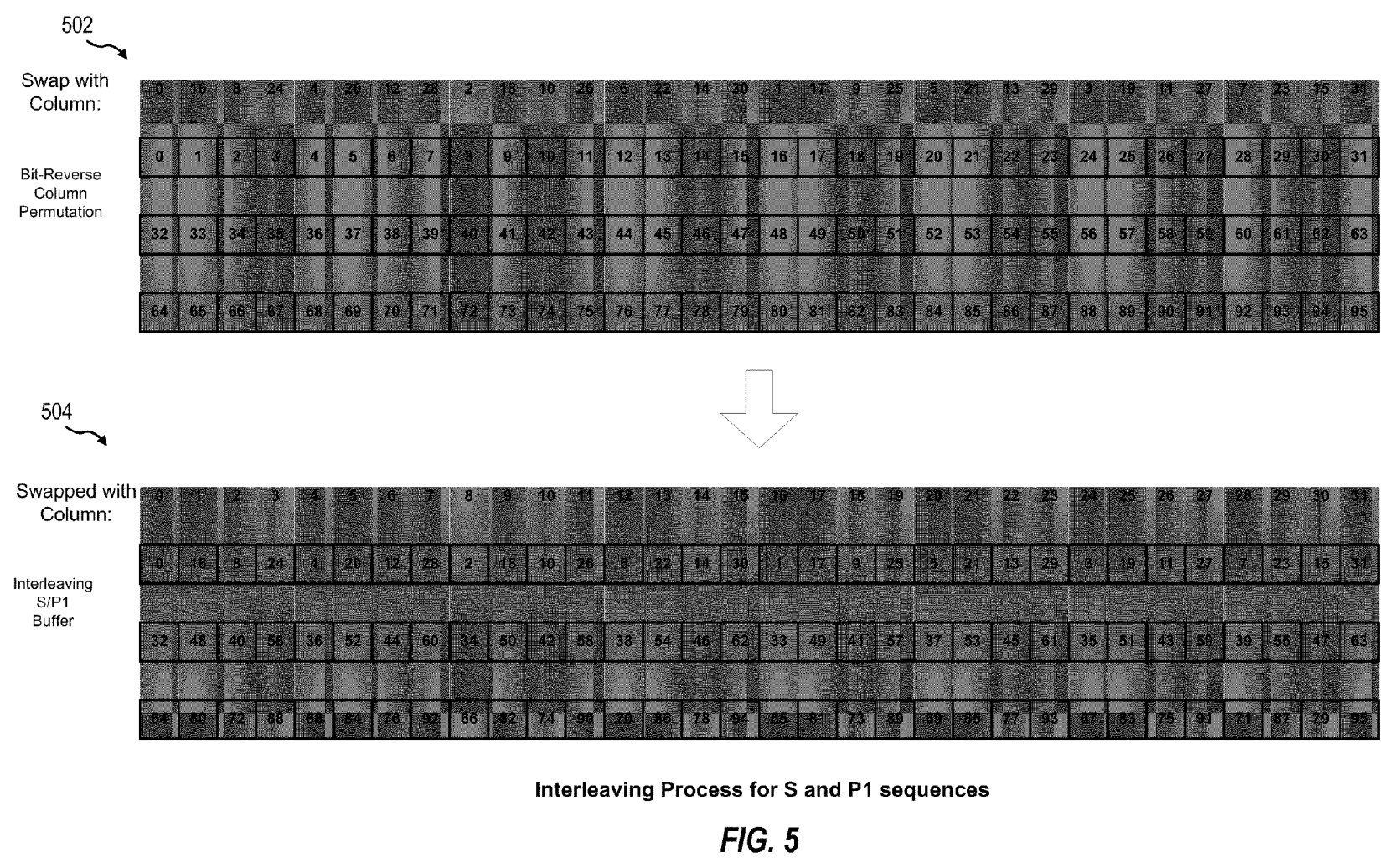

The process for interleaving in Long Term Evolution (LTE) communications is described below. In LTE, the encoded bit sequence is split into 3 sequences Systematic (S), Parity 1 (P1), and Parity 2 (P2). Interleaving is performed on each split sequence independently. For sequences S and P1 a single stage interleaving process may be used. This process is shown in FIG. 5. A matrix block of data 502 is shown. The block shows three rows of data in thirty-two columns. Data bits 0 through 95 are shown in order in their individual row-column locations (indicated by the individual boxes). Although discussed as bits, each data group may be some unit of data such as a single data bit, a group of data bits, etc.

For purposes of illustration of the interleaving process, each column in FIG. 5 is shaded in one of four patterns, which represent the sections the data bits will eventually be located in once interleaved. As illustrated in FIG. 5, LTE interleaving occurs on a column by column basis. For example the second column (called column 1 because the numbering starts with 0), which includes data bits 1, 33, and 65, will be swapped with another column (here column 16), which includes data bits 16, 48, and 80. Block 502 shows the columns that will be swapped as indicated in the top row of numbers called "swap with column." The numbers in this row indicate the column that will be swapped with the columns listed. For example, column 1 will be swapped with column 16, column 2 will be swapped with column 8, column 3 will be swapped with column 24, etc. (Note that column 0 and 31 are not swapped and remain in their original locations in the illustration of FIG. 5.) The interleaving scheme shown in FIG. 5 is referred to as a "bit-reverse" column permutation arrangement where the index of each column represented in binary numbers is swapped with the column having the reverse binary number (except for the first and last columns). For example, column 1 (represented in binary as 00001) is swapped with column 16 (represented in binary as 10000), column 2 (represented in binary as 00010) is swapped with column 8 (represented in binary as 01000), etc.

Block 502 shows the data bits prior to interleaving. Block 504 shows the data bits after the interleaving process has swapped the columns. As shown in block 504, the second column now includes data bits 16, 48, and 80. When the interleaved data is eventually read out for transmission, it is read out column by column. Using block 504 as an example, the data bits will be read out in order by columns: 0, 32, 64, 16, 48, 80, 8, 40, 72, etc.

Further techniques such as dummy bits and pruning may also be used. For example, in block 504 the first data bit to be read out is data bit 0. The first few bits may be comprised of dummy bits, which may be removed prior to transmission (while the filler bits may be kept intact). In one aspect of the present disclosure, the number of dummy bits is a multiple of 4.

The mathematical formula which describes the interleaving process for S and P1 may be expressed in Equation 1 as:

$$\pi(i) = \left(P\left(\left\lfloor \frac{i}{R} \right\rfloor\right) + C \times (i\%R)\right)\%(32 \times R) \qquad \text{Equation 1}$$

where C is the column number of the interleaving matrix, R is the row number of the interleaving matrix, and i=0, 1, 2, ..., 32×R−1. The bit-reverse operation is denoted by the P operator.

Section 36.212 of the 3GPP standard indicates the formulas for interleaving the P2 sequence to be:

$$v_i = y_{\pi(i)} \qquad \text{Equation 2}$$

$$\pi(i) = \left(P\left(\left\lfloor \frac{i}{R} \right\rfloor\right) + C \times (i\%R) + 1\right)\%(32 \times R) \qquad \text{Equation 3}$$

Equation 3 includes a rotate-shifting of the bit sequence by 1 before the same interleaving as indicated by Equation 1. The total number of bits to be interleaved is denoted by K″=32×R; the bit sequence to be interleaved is denoted by $y_0$, $y_1$, $y_2$, ..., $y_{K''-1}$, $v_0$, and $v_1$, $v_2$, ..., $v_{K''-1}$ denotes the interleaved bit sequence.

Figure 6:
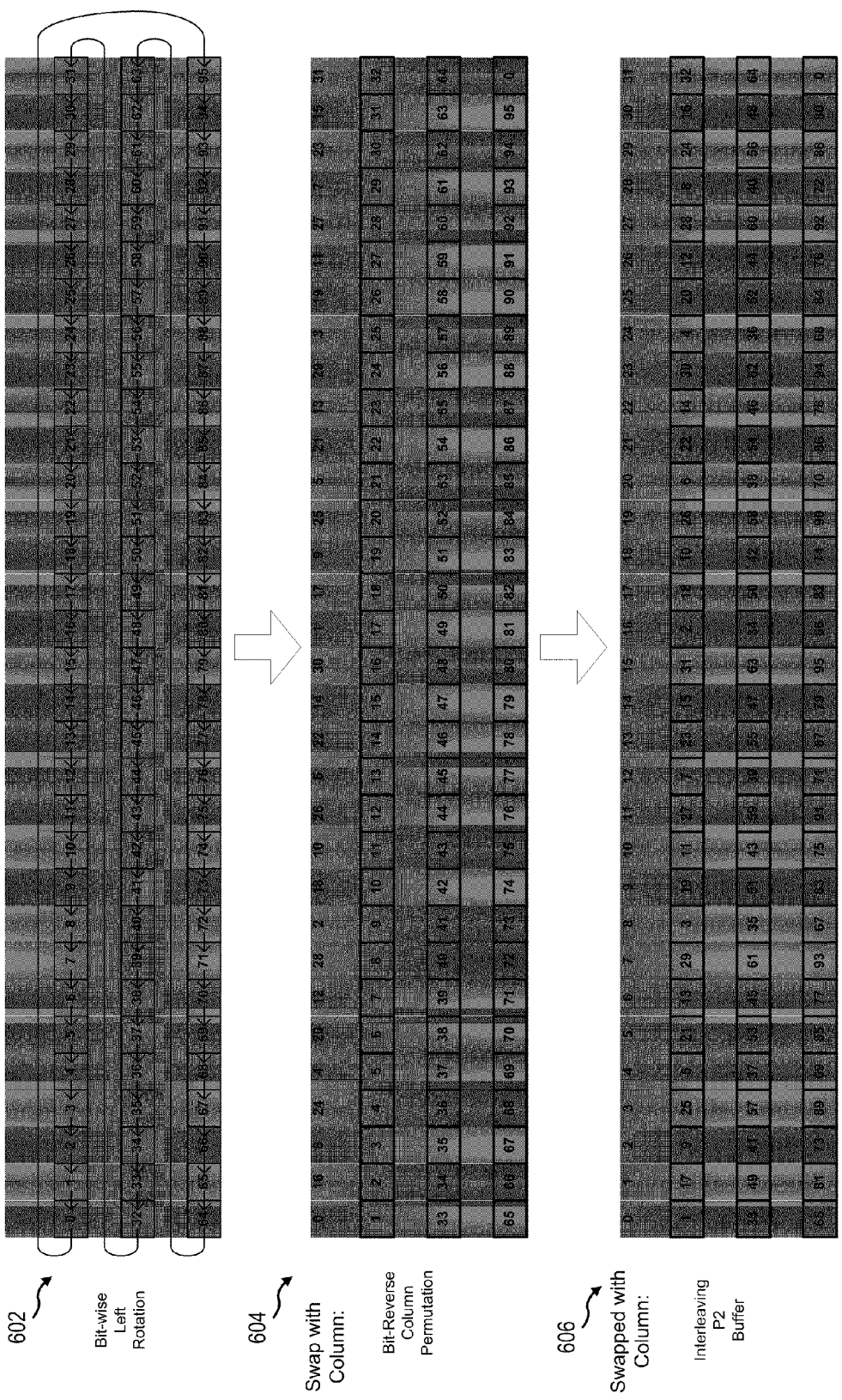
FIG. 6 illustrates P2 row-column matrix code blocks prior to and after bit-reverse column interleaving.

FIG. 6 shows code block matrices illustrating the two-step interleaving process for P2 sequences. For P2 sequences, prior to interleaving a bit-wise left rotation is performed on the data groups. As shown in block 602, the data bits lined up in row-column orientation for illustration purposes, are each rotated left by one location. For example, data bit 2 moves to the location of data bit 1 and data bit 1 moves to the location of data bit 0. Data bits at the leftmost edge of a row (such as data bits 32 and 64) are rotated to the rightmost edge of the row above. Data bit 0 is moved to the rightmost edge of the last row. Block 604 shows the data bit locations following the bit-wise left rotation. After this rotation, the P2 data bits are ready to be interleaved by column as described above with reference to the S and P1 data bits of FIG. 5. The column swap pairs of block 604 are the same as for block 504 (for example, column 16 is swapped with column 1, column 3 is swapped with column 8, etc.). Block 606 shows the P2 data bits of block 604 after column interleaving.

FIG. 7 shows code block matrices illustrating an alternate method for interleaving P2 sequences to arrive at the same interleaved block as illustrated in block 606. Block 702 shows the same starting bit arrangement as block 602. However instead of bit shifting left across all rows and having the leftmost bits of the rows shift down as described in FIG. 6, the bits in each row are shifted left for each row independently, with the leftmost bit of each row being shifted to the rightmost position in that row. Block 704 shows the bits of block 702 left shifted by row as described. Then, as shown in block 706, only the bits of column 31 are shifted up one column with the bit at the uppermost column (bit 0) being shifted to the lowermost column. Then the shifted bits of block 706 are interleaved in the bit-reverse column swap manner previously described, resulting in the interleaved data buffer block 708. Interleaved block 708 is the same as interleaved block 606. The interleaving procedure described in reference to FIG. 7 may be more desirable to implement in hardware than the procedure of FIG. 6.

The processing demands to interleave and deinterleave data signals are significant. Large buffers store all the data following interleaving on the transmitter side and prior to de-interleaving on the receiver side. Significant processing power is also consumed to manage the interleaving and de-interleaving process. On the de-interleaving side, the processing capabilities are contained with a UE (or similar receiving device). An improved de-interleaving process would be beneficial for these UEs.

Offered is a method for improving de-interleaving performance by improving de-interleaving throughput with an efficient and scalable design to process interleaved data. The method is particularly useful for LTE communications but may be applicable to other systems as well.

In LTE, a desired data signal portion may not be precisely the same length as the row-column interleaving arrangement illustrated in FIGS. 5-8. For example, the row-column arrangement is for 96 bits. If the data signal is less than 96 bits, dummy bits are inserted at the beginning of the signal for proper interleaving. In LTE, the number of dummy bits is a multiple of 4. These dummy bits add complexity to the interleaving/de-interleaving process. As noted by FIGS. 5-8, after interleaving the original data bits are evenly distributed in the eventual interleaved data buffer. If dummy bits were inserted, they will also be evenly distributed in the four shaded regions of the interleaved data buffer shown in blocks 504 and 606. This would be true for any number of dummy bits divisible by 4.

Figure 8A:
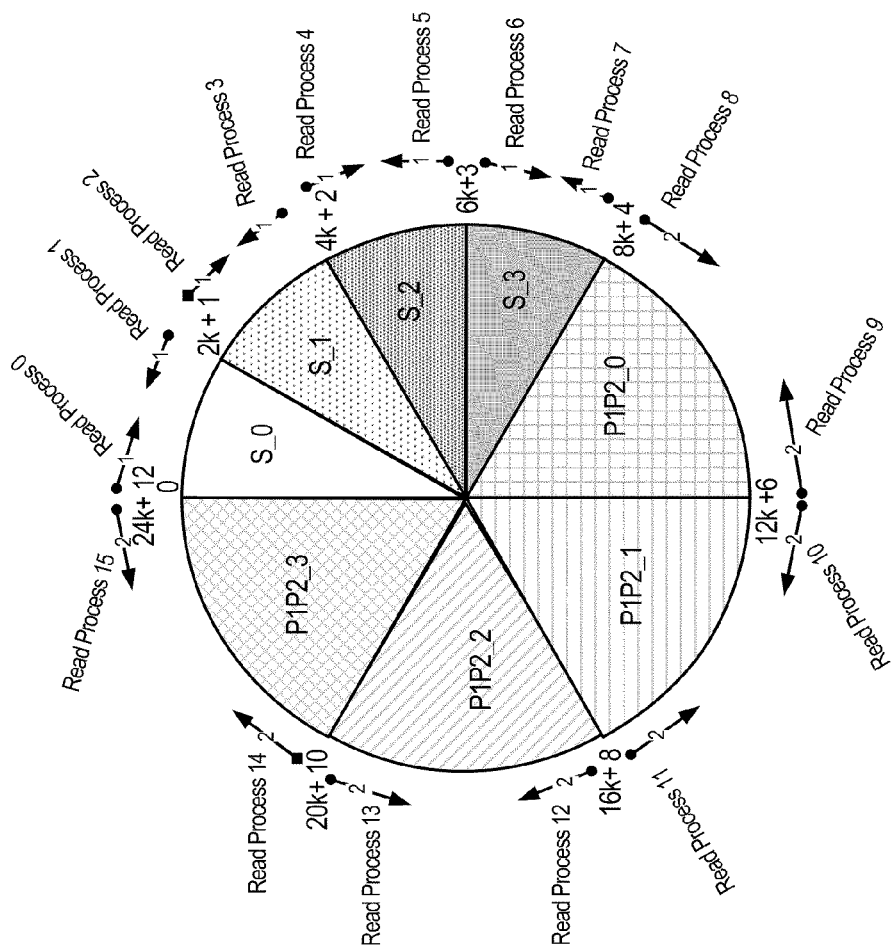
FIG. 8A illustrates reading out code blocks from a circular buffer according to one aspect of the present disclosure.
Figure 8B:
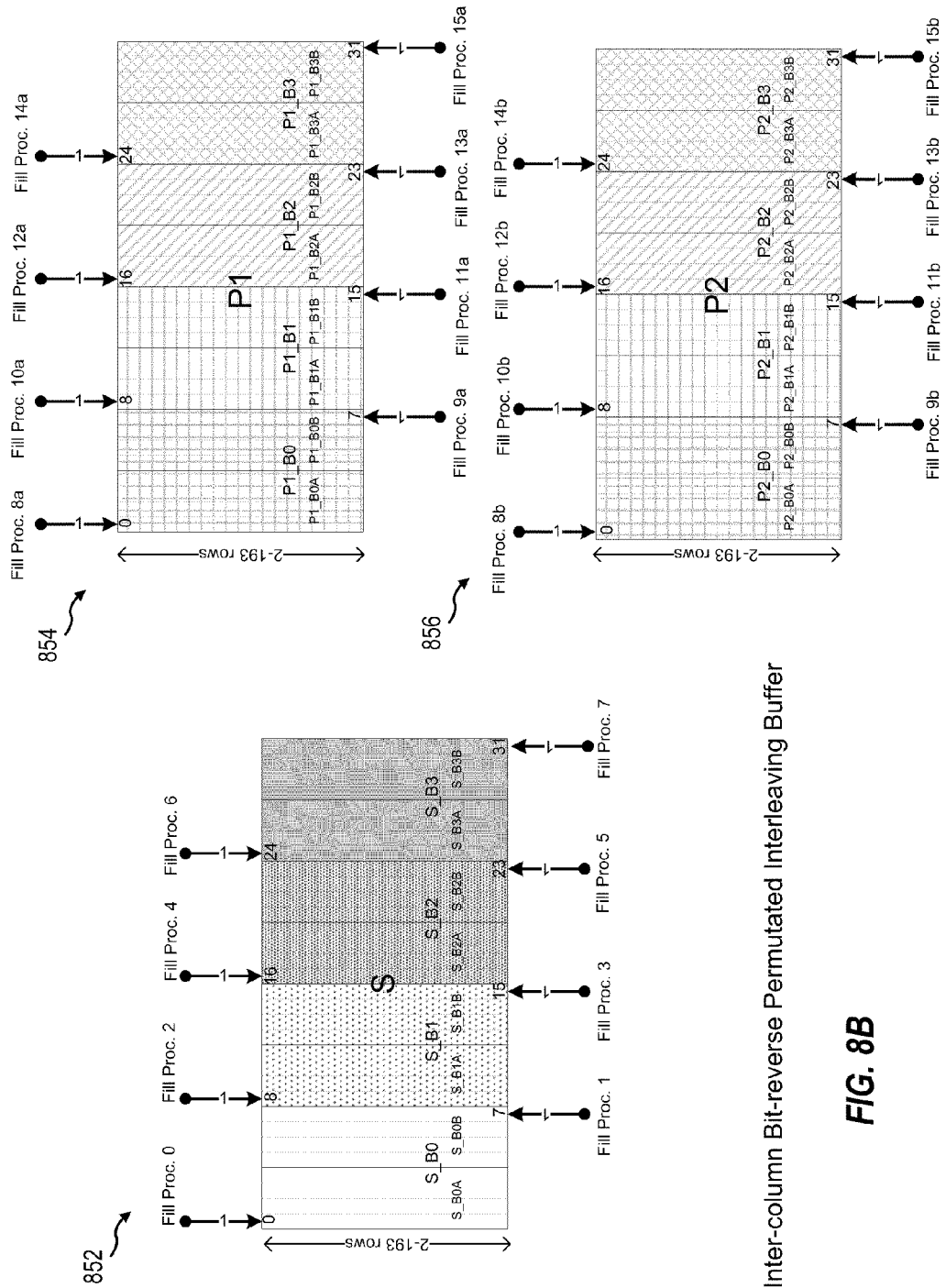
FIG. 8B illustrates processing of bit-reverse column interleaved code blocks according to one aspect of the present disclosure.

The even distribution of interleaved data in LTE may be used to divide and scale processing to improve de-interleaving throughput. Prior to transmission, data sections P1 and P2 are interlaced, meaning bits from P1 and P2 are alternated in sequence prior to transmission. (This results in a transmitted signal with bits alternating (P1 bit, P2 bit, P1 bit, P2 bit, etc.) Thus, the received data includes an S portion and a P1P2 portion. Individual data portions may be divided for processing into portions divisible by 2. FIGS. 8A and 8B illustrates an improved de-interleaving method according to one aspect of the present disclosure.

FIG. 8A illustrates three 8$k$ bit code blocks (one S code block and two P1P2 code blocks) stored in circular buffer, where the S code block and P1P2 code blocks are each respectively divided into four portions. Circular buffers are commonly used in rate matching processes in wireless communication systems. As illustrated, the S portion is divided into S_0, S_1, S_2, and S_3. The P1P2 portions are divided into P1P2_0, P1P2_1, P1P2_2, and P1P2_3. As P1P2 data is interlaced, each P1P2 data portion is twice as large as each S data portion. The S portions are first received in a data signal. S_0 makes up the first portion of the data signal starting at bit 0 (shown just to the right of the border between S_0 and P1P2_3 as illustrated in FIG. 8A) and proceeding clockwise. FIG. 8A represents the process of reading the code blocks after they have been received over wireless transmission and stored in a circular buffer. After being read from the circular buffer as shown in FIG. 8A they are placed in a de-interleaving buffer and de-interleaved as shown in FIG. 8B.

As illustrated in FIG. 8A, each S data portion is 2,000 (2$k$) bits long and each P1P2 data portion is 4,000 (4$k$) bits long. Each data section may be read out in two directions simultaneously. That is the beginning of a data section may be read out at the same time as the end of the data section, with each process meeting in the middle. For example, as shown in FIG. 8A, Read Process 0 and Read Process 1 will each simultaneously read data from section S_0, with Read Process 0 reading forward starting at bit 0 and Read Process 1 reading in reverse and starting with bit 2$k$. Read Process 0 and Read Process 1 will each end their respective reading in the middle of section S_0. By employing both forward and reverse reading in this manner, each code section may be read out twice as fast. Of the sixteen read processes, eight process one log likelihood ratio (LLR) for each cycle (indicated by a 1 in its arrow), eight process two LLRs per cycle (indicated by a 2 in its arrow). As indicated by the arrows in FIG. 8A, eight of the read processes read forward, eight read backward. Table 1 below lists the read processes illustrated in FIG. 8A, the data sections they read out, as well as their respective starting bits, directions, and number of LLRs for each cycle.

TABLE 1

Read Processes of FIG. 8A

| Process | Section Read Out | Direction | Starting Bit | # of LLRs Per Cycle |
|---|---|---|---|---|
| Read Process 0 | S_0 | Forward | 0 | 1 |
| Read Process 1 | S_0 | Reverse | 2k | 1 |
| Read Process 2 | S_1 | Forward | 2k + 1 | 1 |
| Read Process 3 | S_1 | Reverse | 4k + 1 | 1 |
| Read Process 4 | S_2 | Forward | 4k + 2 | 1 |
| Read Process 5 | S_2 | Reverse | 6k + 2 | 1 |
| Read Process 6 | S_3 | Forward | 6k + 3 | 1 |
| Read Process 7 | S_3 | Reverse | 8k + 3 | 1 |
| Read Process 8 | P1P2_0 | Forward | 8k + 4 | 2 |
| Read Process 9 | P1P2_0 | Reverse | 12k + 5 | 2 |
| Read Process 10 | P1P2_1 | Forward | 12k + 6 | 2 |
| Read Process 11 | P1P2_1 | Reverse | 16k + 7 | 2 |
| Read Process 12 | P1P2_2 | Forward | 16k + 8 | 2 |
| Read Process 13 | P1P2_2 | Reverse | 20k + 9 | 2 |
| Read Process 14 | P1P2_3 | Forward | 20k + 10 | 2 |
| Read Process 15 | P1P2_3 | Reverse | 24k + 12 | 2 |

Once read out by the processes shown in FIG. 8A, the data is placed in an interleaving buffer as shown in FIG. 8B. The shading of data groups in the circular buffer of FIG. 8A matches the shading of data groups in the interleaving buffer of FIG. 8B. Prior to being placed in an interleaving buffer, the P1P2 code signals are de-interlaced and separated into component P1 and P2 portions. Thus, as shown in FIG. 8B, the interleaving buffer includes the S code portion 852, the P1 code portion 854, and the P2 code portion 856. As shown in FIG. 8, each interleaving matrix may be between 2 and 193 rows.

Each of the code portions of one data type are identical in terms of processing to de-interleave the data. Because dummy bits are spread evenly across the regions, and because each section is interleaved using a similar bit-reverse procedure, the interleaved structure is identical. Thus an identical processing engine may de-interleave these sections independently of each other. Further, each code section may be de-interleaved forward and backward simultaneously. For example, as illustrated in FIG. 8B, Fill Process 0 and Fill Process 1 each simultaneously de-interleave section S_B0. Fill Process 0 starts at column 0 and de-interleaves the first portion (S_B0A) of section S_B0 forward. Fill Process 1 starts at column 7 and de-interleaves the second portion (S_B0B) of section S_B0 backward. Table 2 below lists the fill processes illustrated in FIG. 8B, along with the data section they de-interleave, as well as their respective starting locations and directions.

TABLE 2

Fill Processes of FIG. 8B

| Process | Section Processed | Direction | Starting Column |
|---|---|---|---|
| Fill Process 0 | S_0 | Forward | 0 |
| Fill Process 1 | S_0 | Reverse | 7 |
| Fill Process 2 | S_1 | Forward | 8 |
| Fill Process 3 | S_1 | Reverse | 15 |
| Fill Process 4 | S_2 | Forward | 16 |
| Fill Process 5 | S_2 | Reverse | 23 |
| Fill Process 6 | S_3 | Forward | 24 |
| Fill Process 7 | S_3 | Reverse | 31 |
| Fill Process 8a | P1_B0A | Forward | 0 |
| Fill Process 9a | P1_B0B | Reverse | 7 |
| Fill Process 10a | P1_B1A | Forward | 8 |
| Fill Process 11a | P1_B1B | Reverse | 15 |
| Fill Process 12a | P1_B2A | Forward | 16 |
| Fill Process 13a | P1_B2B | Reverse | 23 |
| Fill Process 14a | P1_B3A | Forward | 24 |
| Fill Process 15a | P1_B3B | Reverse | 31 |
| Fill Process 8b | P2_B0A | Forward | 0 |
| Fill Process 9b | P2_B0B | Reverse | 7 |
| Fill Process 10b | P2_B1A | Forward | 8 |
| Fill Process 11b | P2_B1B | Reverse | 15 |
| Fill Process 12b | P2_B2A | Forward | 16 |
| Fill Process 13b | P2_B2B | Reverse | 23 |
| Fill Process 14b | P2_B3A | Forward | 24 |
| Fill Process 15b | P2_B3B | Reverse | 31 |

As illustrated in FIG. 8B, a fill engine operates twenty-four fill processes simultaneously for each cycle. The number of fill processes may be scaled as desired in a manner divisible by four, for example to twelve, six, or three. Thus, as illustrated a received interleaved code block may be divided into portions (which may be equally sized) and de-interleaved independently, such de-interleaving may occur both forward and backward for particular code sections. This arrangement is possible because of the inter-column bit-reverse permutated interleaving process, as described below. Thus, the fill processes reproduce, on the receiving end, the row-column code blocks as they appeared prior to interleaving (as shown in blocks 502, 604, and 704 of FIGS. 5-7).

As specified in LTE, filler and dummy bits come in groups divisible by four, and thus come in groups of adjacent four columns prior to interleaving (such as in code blocks 502, 602, and 702 discussed above). Once interleaved the dummy bits are evenly distributed in the received interleaved signal regardless of the exact number of dummy bits. Aspects of this disclosure take advantage of this property to improve de-interleaving.

Prior to interleaving, dummy bits may be inserted at the beginning or end of code block sections. Prior to code block sections being read out as described in FIG. 8A, the location of these dummy bits in the received interleaved signal are identified so that the read processes can avoid the dummy bits when reading out to the interleaving buffer. For an $8k$ bit sized code block, dummy bits originally located at the beginning of a pre-interleaved code block that will be pruned from the received interleaved code block in the circular buffer shown in FIG. 8A will be located at bits indicated by Equation 4 below:

$$(2K+1) \times i - 1, i = 1, 2, 3, 4 \qquad \text{Equation 4}$$

The corresponding location of the dummy bits in a pre-interleaved code block in the inter-column bit-reverse permutated interleaving buffer shown in FIG. 8B is indicated by Equation 5:

$$\left\lceil \frac{8K+4}{32} \right\rceil \times 8i - 1, i = 1, 2, 3, 4 \qquad \text{Equation 5}$$

The locations specified by Equation 5 correspond to bit locations 92, 94, 93 and 95 in interleaved buffer blocks 504, 606, and 708 discussed above in reference to FIGS. 5-7. As Equations 4 and 5 identify the locations of dummy bits in FIGS. 8A and 8B, respectively, the equations also identify the starting points for certain read and fill processes of FIGS. 8A and 8B. Equation 4 identifies the starting points for reverse Read Processes 1, 3, 5, and 7 of FIG. 8A and Equation 5 identifies the starting points for reverse Fill Processes 1, 3, 5, and 7 of FIG. 8B.

The location of other dummy bits in the circular block are indicated by Equation 6 below:

$$(2K+1) \times i, i = 0, 1, 2, 3 \qquad \text{Equation 6}$$

Similarly, the corresponding location of the dummy bits in a pre-interleaved code block in the inter-column bit-reverse permutated interleaving buffer shown in FIG. 8B is indicated by Equation 7:

$$\left\lceil \frac{8K+4}{32} \right\rceil \times 8i + 1, i = 0, 1, 2, 3 \qquad \text{Equation 7}$$

The fill points just before the points given in Equation 7 are all dummy bits, regardless of the number of dummy bits. Equation 6 identifies the starting points for forward Read Processes 0, 2, 4, and 6 of FIG. 8A and Equation 7 identifies the starting points for forward Fill Processes 0, 2, 4, and 6 of FIG. 8B. Using the symmetry of the dummy bit locations across a code block, the starting points for Read Processes 8-15 and Fill Processes 8a-15a and 8b-15b may be determined from the starting points for Read Processes 0-7 and Fill Processes 0-7 identified using Equations 4-7.

The fill engine de-interleaves a P2 code block to replicate code block 704 as shown in FIG. 7. As the 0 bit is a dummy bit, the last bit in the circular buffer is the last bit in the interleaving buffer (just prior to row-up rotation). Thus, the fill engine may process P2 bits similarly to P1 bits as if the row rotation is not applied. While filling the interleaving row-column matrices, the bit position is tracked to determine if it is the position of a dummy bit or a filler bit and, if so, the LLR is filled into the next location.

Figure 9:
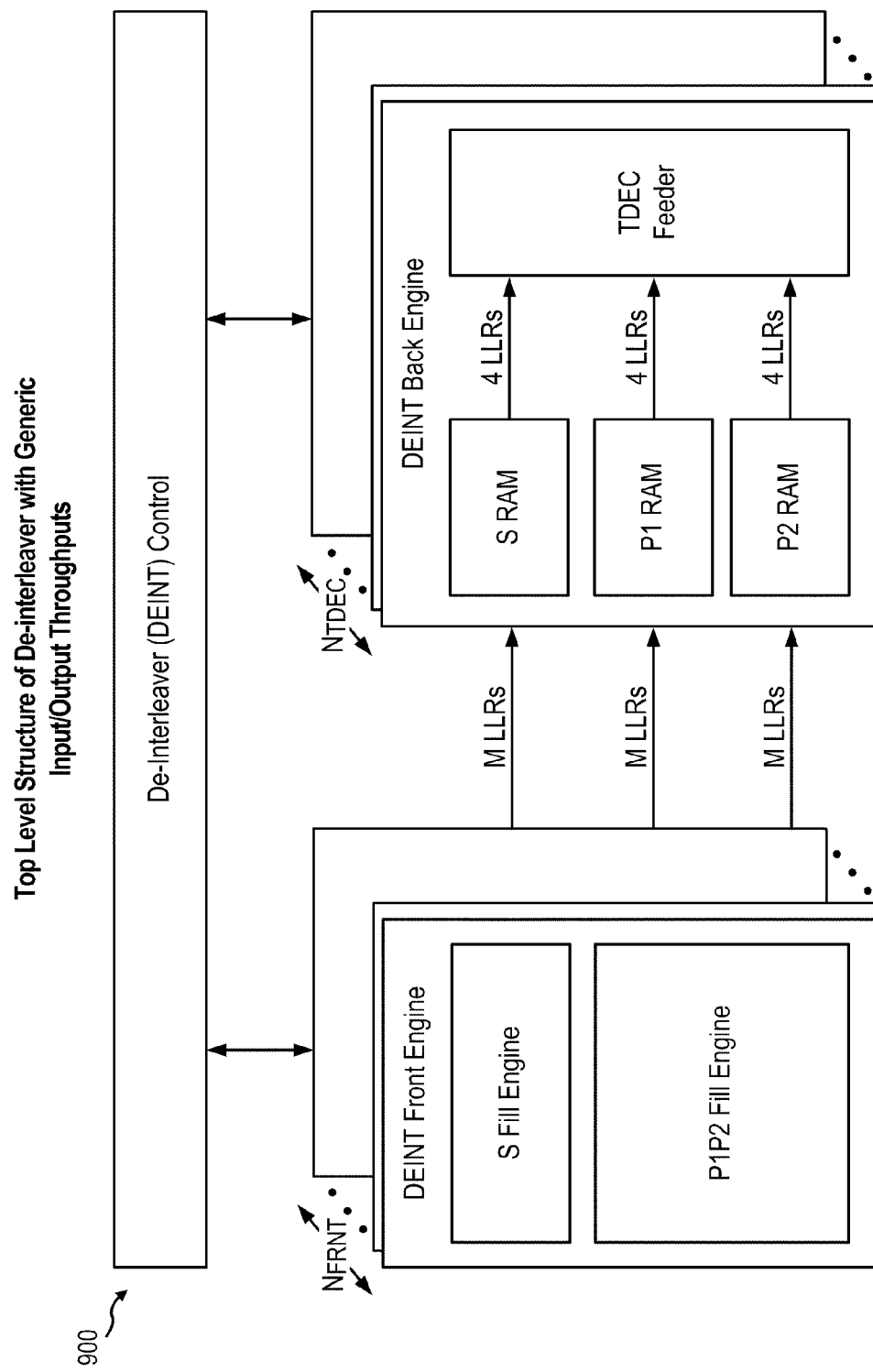
FIG. 9 is a block diagram of a de-interleaver according to one aspect of the present disclosure.

An exemplary top level structure of a de-interleaver 900 is shown in FIG. 9, where $N_{FRNT}$ (e.g., eight for a UE) front engines are installed to provide generic de-interleaver input throughput of $3 \times N_{FRNT}$ LLRs for each cycle. $N_{TDEC}$ (e.g., eight for a UE) back engines are instantiated to support feeding $N_{TDEC}$ turbo decoders. The de-interleaver de-interleaves the code block in two steps. First the de-interleaver front engines read the LLRs out from a filler and dummy bit pruned rate matching circular buffer (shown in FIG. 8A) stored in LLR RAM, and reproduce the inter-column permutated interleaving S, P1, and P2 buffers (shown in FIG. 8B). Next de-interleaver back engines, a.k.a. TDEC feeders, reverse the inter-column permutation while reading out the LLRs out of S, P1, and P2 buffers. The tail bits are also handled properly to meet chip rate detector turbo decoding specifications.

To avoid to a memory access conflict, each fill process accesses a memory bank section exclusively, so the memories for S, P1, and P2 interleaving matrices/buffers are partitioned into 8 memory banks each, where each bank contains four consecutive columns. Together, the 32 columns of each S, P1, and P2 bank hold the bit-reverse column permutated LLRs as they were in the interleaver matrices before being read out for transmission.

The turbo decoder simultaneously accesses the last 2 bit column numbers {00, 01, 10, 11} of de-interleaved columns, so that two adjacent LLRs may be delivered forward and two adjacent LLRs can be delivered in reverse during the same cycle. The provided memory banking scheme supports such access without memory access conflict for feeding the turbo decoder. To support eight turbo decoders, there are eight copies of such 24 banks, where one copy serves as the symbol input buffer for one turbo decoder.

The read out, which is performed by the de-interleaver back engines, reverses the inter-column permutation for S, P1, and P2 bits as shown in FIGS. 5 and 7. The dummy bits are also dropped before feeding the turbo decoders.

When configured to run for the increased parallelism for increased throughput, eight fill engines (shown as Fill Processes 0-7 in FIG. 8B) working on the S buffers fetch 32 LLRs each from the designated HARQ buffer (also called the interleaving buffer, illustrated in FIG. 8B). While their content is the same, an interleaving buffer traditionally resides in a transmitter while a HARQ buffer traditionally resides in a receiver. Four of the eight engines fill in forward into the S banks (one LLR for each cycle for each engine), while each of the remaining four engines fill in backward (also at one LLR for each cycle per engine). There are eight fill engines working on the P1 and P2 buffers (shown as Fill Processes 8-15 in FIG. 8B). These engines fetch 32 LLRs from the designated HARQ buffer. Four of these eight engines fill forward one LLR into the P1 bank and one LLR into the P2 bank for each cycle for each engine, while the remaining four engines fill in backward one LLR into the P1 bank and one LLR into the P2 bank per cycle for each engine. In case the 2 LLRs read for P1P2 are all for P2, then the P1 fill process is stalled for 1 cycle, while the P2 fill process fills these 2 LLRs in 2 cycles, one for each cycle.

Figure 10:
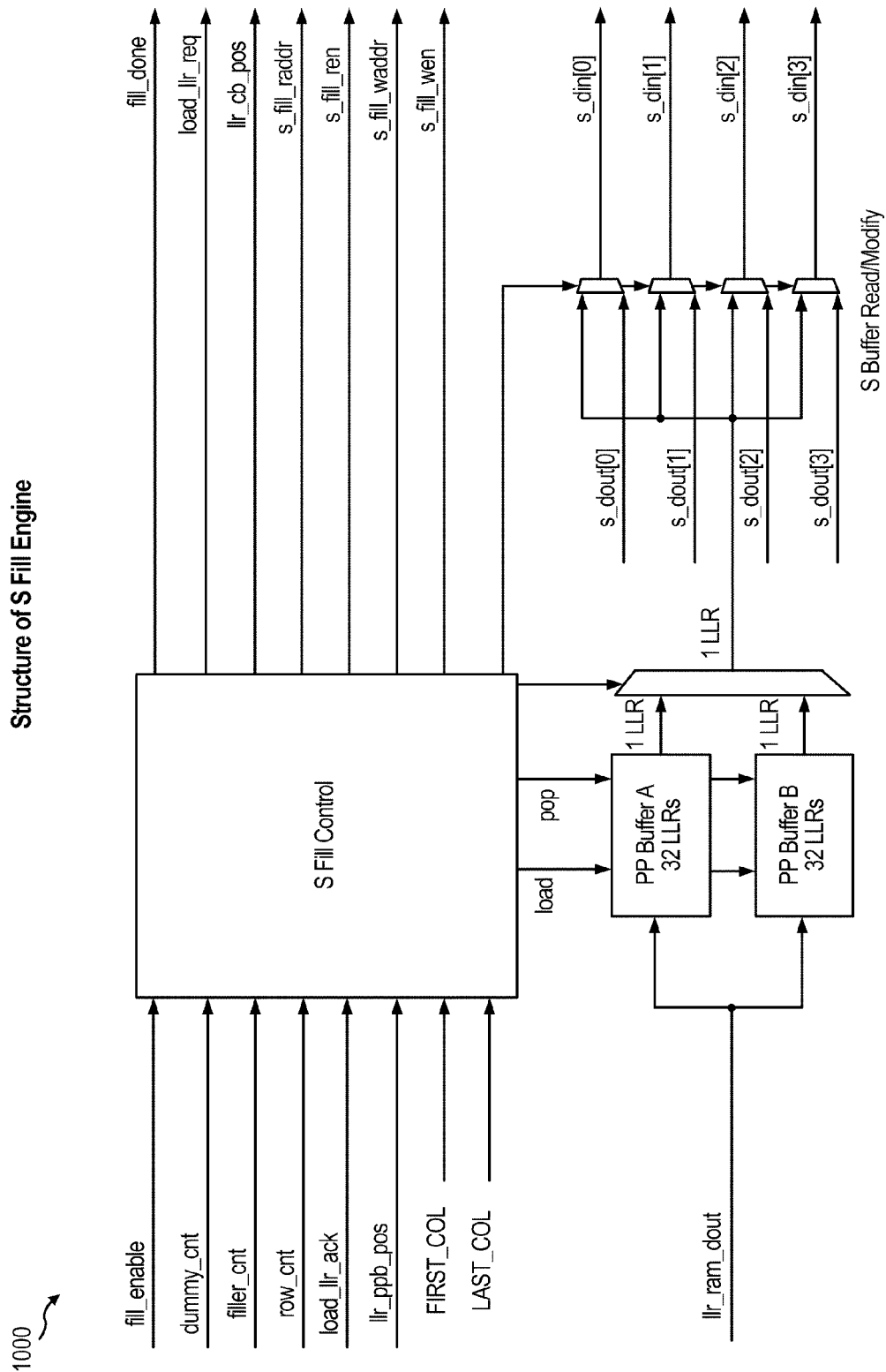
FIG. 10 is a block diagram of an S Fill Engine according to one aspect of the present disclosure.

An exemplary S Fill Engine 1000, as shown in FIG. 10, reproduces the S interleaving buffer. The S Fill Engine generates the read/modify signals to the S buffer for filling the LLRs into the appropriate positions. The control signals shown in FIG. 10 operate as shown in Table 1.

TABLE 1

| Control Signal | Type | Function |
| --- | --- | --- |
| fill_enable | Input | Enables the S de-interleaving function when asserted |
| dummy_cnt | Input | Informs the S de-interleaving controller how many dummy bits are in the stream to be de-interleaved |
| filler_cnt | Input | Informs the S de-interleaving controller how many filler bits are in the stream to be de-interleaved |
| row_cnt | Input | Informs the S de-interleaving controller how many rows in the interleaving matrix |
| load_llr_ack | Input | Informs the S de-interleaving controller that a loading request of LLR has been served |
| llr_ppb_pos | Input | Informs the S de-interleaving controller where the first loaded LLR should reside in the ping-pong buffer |
| FIRST_COL | Input | Informs the S de-interleaving controller the first column number for the portion of the stream this S de-interleaver is working on |
| LAST_COL | Input | Informs the S de-interleaving controller the last column number for the portion of the stream this S de-interleaver is working on |
| llr_ran_dout | Input | Is the RAM data output from the RAM storing LLRs |

TABLE 1-continued

| Control Signal | Type | Function |
| --- | --- | --- |
| fill_done | Output | Signals the de-interleaving process is complete for this the S de-interleaver |
| load_llr_req | Output | Sends a request for loading LLRs streams to be de-interleaved |
| llr_cb_pos | Output | Informs the downstream block where the starting position is in the circular buffer for the deinterleaved stream completed by this de-interleaver |
| s_fill_raddr | Output | Informs the read address of RAM for storing the deinterleaved stream generated by this block |
| s_fill_ren | Output | Enables the reading of the RAM storing the de-interleaved stream |
| s_fill_waddr | Output | Gives the write address of RAM for writing the de-interleaved stream into the RAM |
| s_fill_wen | Output | Enables the writing of the deinterleaved stream to the RAM for storing the deinterleaved stream |
| s_din(0) | Output | Puts the LLRs to the RAM bank0 for S |
| s_din(1) | Output | Puts the LLRs to the RAM bank1 for S |
| s_din(2) | Output | Puts the LLRs to the RAM bank2 for S. |
| s_din(3) | Output | Puts the LLRs to the RAM bank3 for S |

Figure 11:
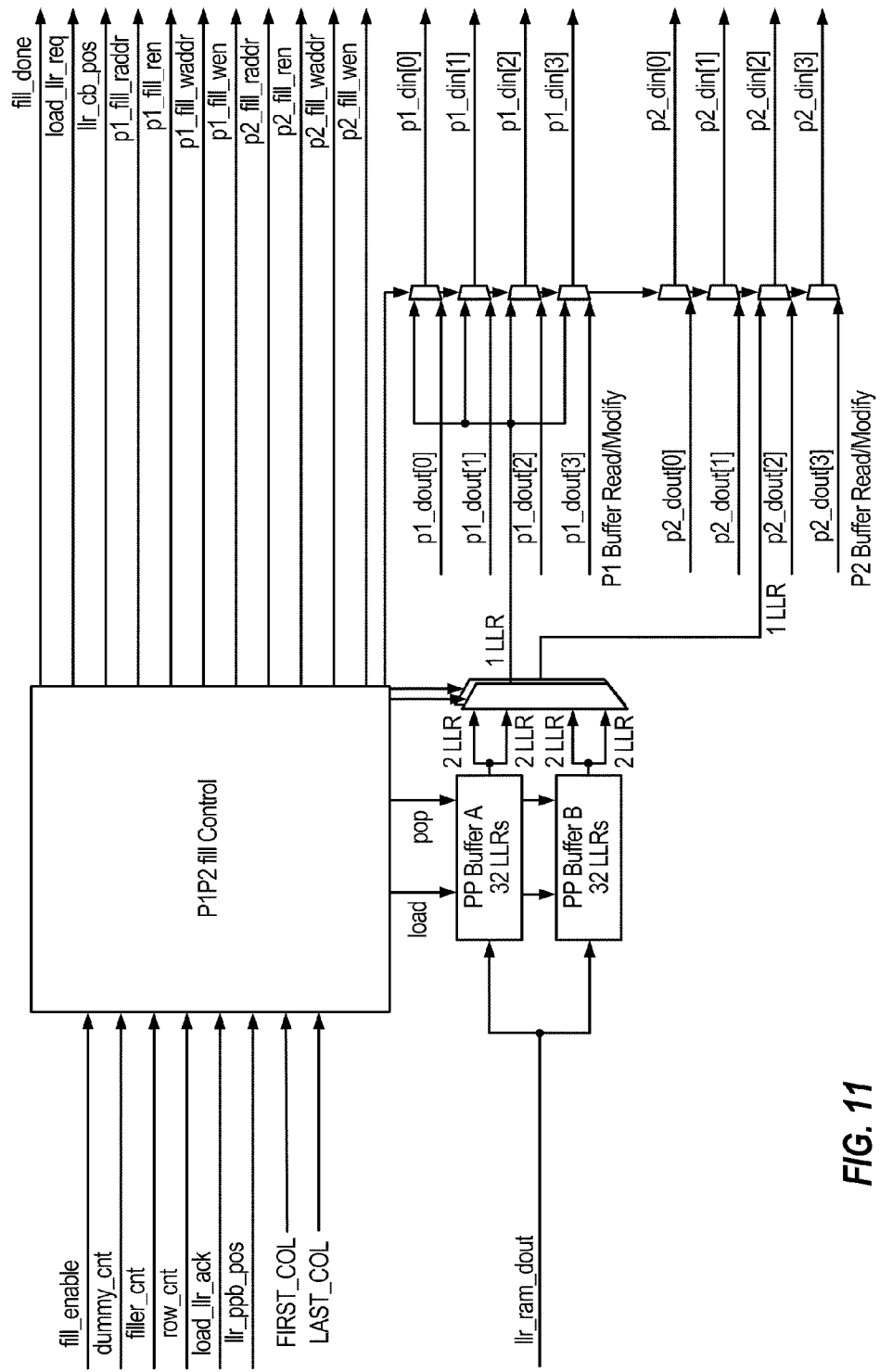
FIG. 11 is a block diagram of a P1P2 Fill Engine according to one aspect of the present disclosure.

An exemplary P1P2 Fill Engine 1100, as shown in FIG. 11 reproduces the P1 interleaving buffer as shown in block 502 of FIG. 5 and P2 interleaving buffer without row up rotation as shown in block 704 of FIG. 7. The P1P2 Fill Engine generates the two sets of read/modify signals to the P1 and P2 buffers for filling the LLRs into the appropriate positions. The control signals shown in FIG. 11 operate as shown in Table 2.

TABLE 2

| Control Signal | Type | Function |
| --- | --- | --- |
| fill_enable | Input | Enables the P1P2 de-interleaving function when asserted |
| dummy_cnt | Input | Informs the P1P2 de-interleaving controller how many dummy bits are in the stream to be de-interleaved |
| filler_cnt | Input | Informs the P1P2 de-interleaving controller how many filler bits are in the stream to be de-interleaved |
| row_cnt | Input | Informs the P1P2 de-interleaving controller how many rows in the interleaving matrix |
| load_llr_ack | Input | Informs the P1P2 de-interleaving controller that a loading request of LLR has been served |
| llr_ppb_pos | Input | Informs the P1P2 de-interleaving controller where the first loaded LLR should reside in the ping-pong buffer |
| FIRST_COL | Input | Informs the P1P2 de-interleaving controller the first column number for the portion of the stream this P1P2 de-interleaver is working on |
| LAST_COL | Input | Informs the P1P2 de-interleaving controller the last column number for the portion of the stream this P1P2 de-interleaver is working on |
| llr_ran_dout | Input | Is the RAM data output from the RAM storing LLRs. |
| fill_done | Output | Signals the de-interleaving process is done for this the P1P2 de-interleaver |
| load_llr_req | Output | Sends a request for loading LLRs streams to be de-interleaved |
| llr_cb_pos | Output | Informs the downstream block where the starting position is in the circular buffer for the deinterleaved stream completed by this de-interleaver |
| p1_fill_raddr | Output | Informs the read address of RAM for storing the deinterleaved P1 stream generated by this block |
| p1_fill_ren | Output | Enables the reading of the RAM storing the de-interleaved P1 stream |
| p1_fill_waddr | Output | Gives the write address of RAM for writing the de-interleaved P1 stream into the RAM |
| p1_fill_wen | Output | Enables the writing of the deinterleaved P1 stream to the RAM for storing the deinterleaved stream |

TABLE 2-continued

| Control Signal | Type | Function |
| --- | --- | --- |
| p2_fill_raddr | Output | Informs the read address of RAM for storing the deinterleaved P2 stream generated by this block |
| p2_fill_ren | Output | Enables the reading of the RAM storing the de-interleaved P2 stream |
| p2_fill_waddr | Output | Gives the write address of RAM for writing the de-interleaved P2 stream into the RAM |
| p2_fill_wen | Output | Enables the writing of the deinterleaved P2 stream to the RAM for storing the deinterleaved stream |
| p1_din(0) | Output | Puts the LLRs to the RAM bank0 for P1 |
| p1_din(1) | Output | Puts the LLRs to the RAM bank1 for P1 |
| p1_din(2) | Output | Puts the LLRs to the RAM bank2 for P1 |
| p1_din(3) | Output | Puts the LLRs to the RAM bank3 for P1 |
| p2_din(0) | Output | Puts the LLRs to the RAM bank0 for P2 |
| p2_din(1) | Output | Puts the LLRs to the RAM bank1 for P2 |
| p2_din(2) | Output | Puts the LLRs to the RAM bank2 for P2 |
| p2_din(3) | Output | Puts the LLRs to the RAM bank3 for P2 |

Figure 12:
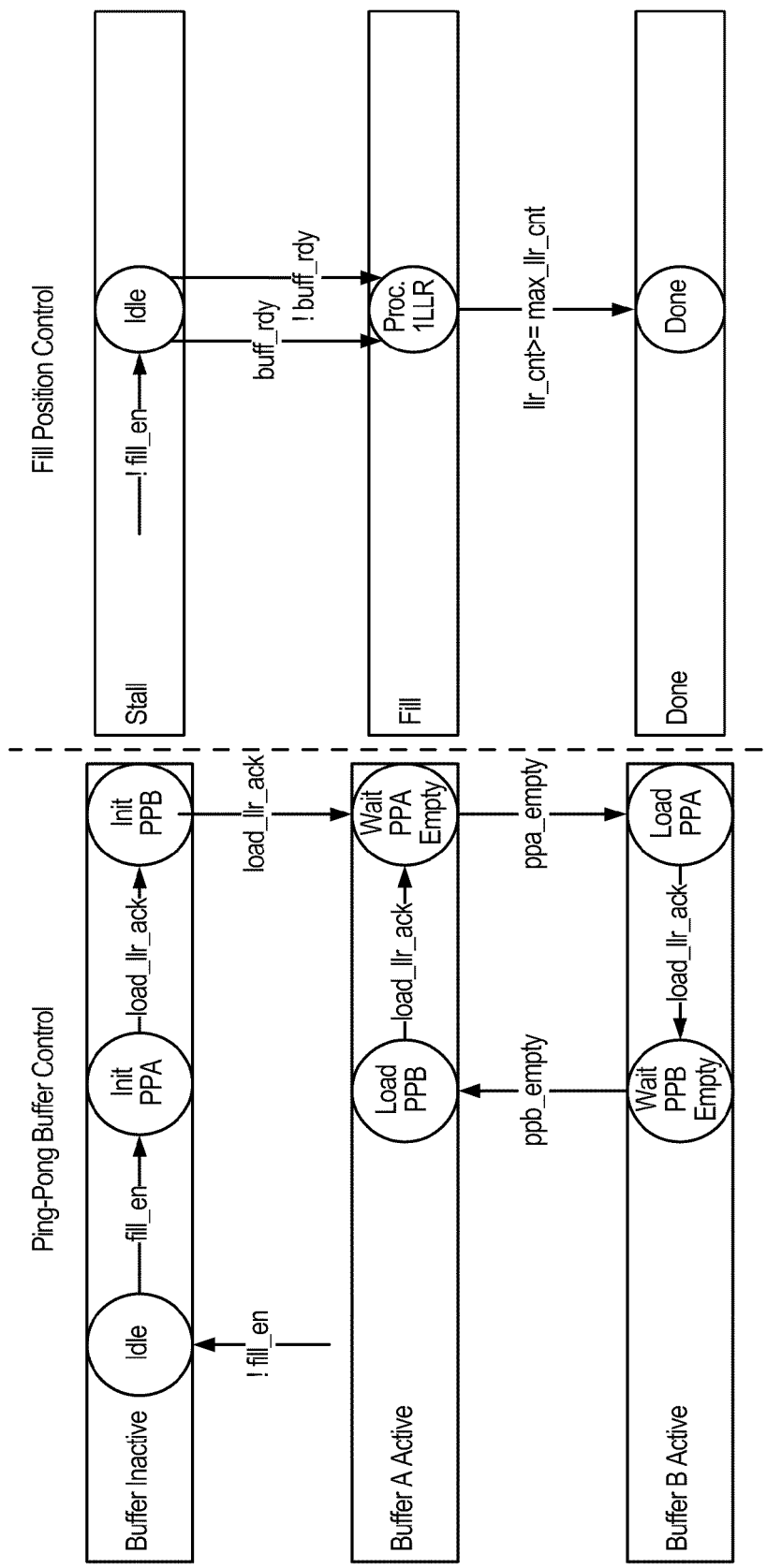
FIG. 12 is a block diagram of a S Fill Engine Finite State Machine according to one aspect of the present disclosure.

The control of the S fill engine is maintained mainly by two finite state machines (FSMs), one for controlling the ping-pong buffer, and one for controlling the filling position for the S interleaving buffer. These finite state machines are shown in FIG. 12.

The finite state machines for ping-pong buffer control is similar to the finite state machines for HARQ. It allows loading of one ping-pong buffer to work in parallel with filling up S interleaving matrix using the other ping-pong buffer.

The finite state machines for fill position control maintains the filling row and column position (counters) of the S interleaving buffer as well as the current LLR position in the rate matching circular buffer where the filler and dummy bits are pruned (shown in FIG. 8A). Because the filler bits are present in the top two rows and the dummy bits are present in the top row, the skipping (advance to the next one or next two) is only addressed when the filling position are in the $1^{st}$ or $2^{nd}$ row of the S buffer. If a filler bit is present in the $2^{nd}$ row, the $1^{st}$ row of the same column is either a dummy bit or a filler bit, so two positions will be jumped over for filling in the current LLR. If the dummy or filler bit is in $1^{st}$ row and there is no filler bit in the $2^{nd}$ row of the same column, only one S interleaving position needs to be jumped over for filling in the current LLR. All the other filling cases are performed linearly without skipping.

If the ping-pong buffer is not ready to deliver LLRs for filling, the "Idle" state is entered in order to wait for the ping-pong buffer to be ready. When the LLRs that are to be filled are processed, the "Done" state is entered. Top level control will desert the fill enable ("fill_en") until the next de-interleaving task, and hence sets the finite state machines for filling position control into the "Idle" state and waits for the ping-pong buffer to be ready. For each LLR processed by S fill engine, up to 15 fill positions may be advanced (for the case where there are 56 filler bits).

Figure 13:
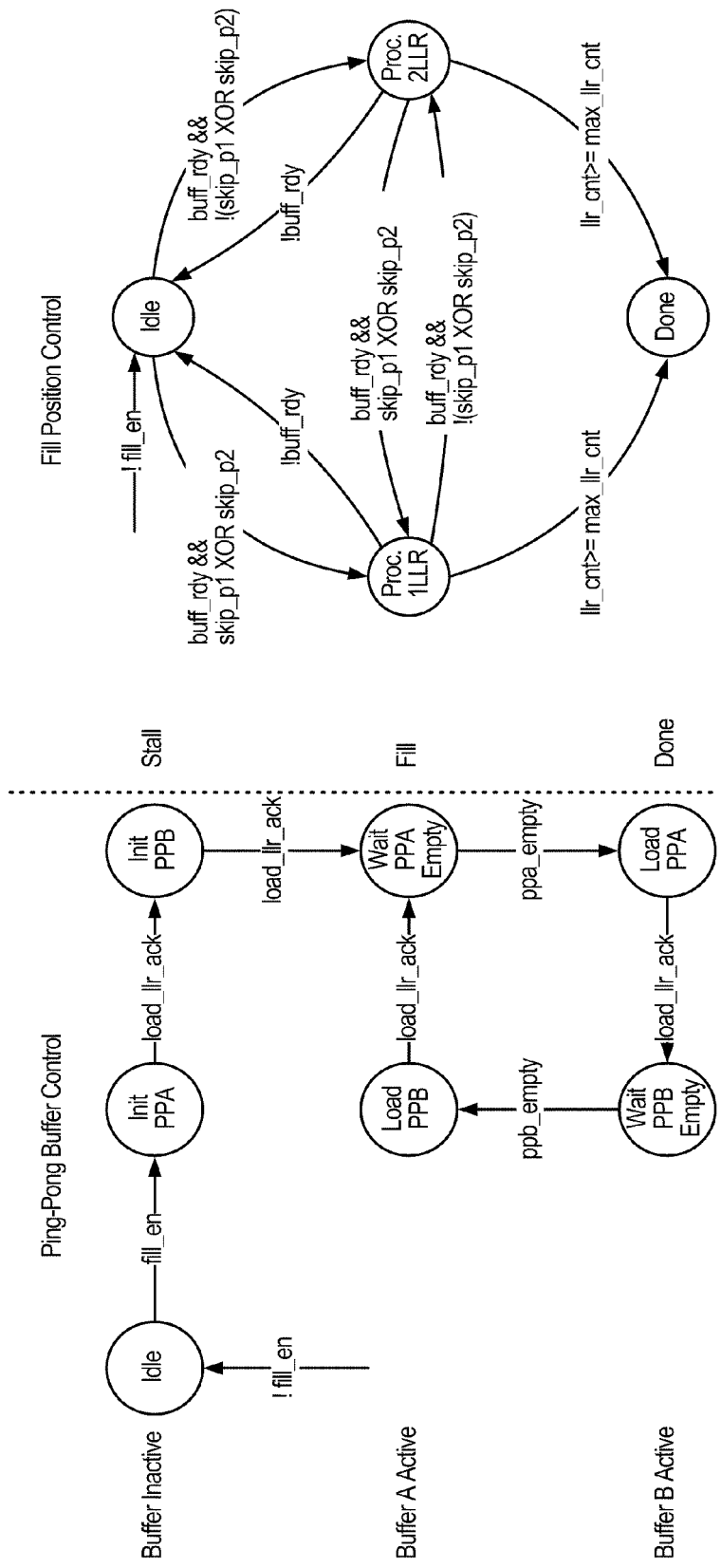
FIG. 13 is a block diagram of a P1P2 Fill Engine Finite State Machine according to one aspect of the present disclosure.

The P1P2 Fill Engine is controlled mainly by two finite state machines, one for controlling the ping-pong buffer, and one for controlling the filling position for P1 interleaving matrix and P2 interleaving matrix. Exemplary finite state machines are shown in FIG. 13. The finite state machine of FIG. 13 is similar to the finite state machine of FIG. 12, however they differ in fill-position generation control. The aspect shown in FIG. 12 processes one LLR at a time from the S stream, where the aspect shown in FIG. 13 processes two LLRs at a time from the P1P2 stream.

The finite state machines for ping-pong buffer control is similar to the finite state machines for HARQ. It allows loading a ping-pong buffer to work in parallel for filling up P1 and P2 interleaving matrices using another ping-pong buffer. The finite state machines for fill position control maintain the filling row and column position (counters) of P1 and P2 interleaving buffers as well as the current LLR position in the rate matching circular buffer, where the filler and dummy bits are pruned. Because the pruned filler bits are present in the top two rows of the P1 interleaving buffer and the dummy bits are present in the first row of P1 and P2 buffers, skipping (advance to the next one or next two) is performed when the filling position is in the $1^{st}$ or $2^{nd}$ row of the P1 and P2 buffer.

Because the P2 filler bits are not pruned and the P1 filler bits are pruned, and because P1 and P2 are interleaved differently, there is no symmetry (similarity) between P1 and P2 to be exploited. To simplify the hardware control, for every two LLRs being processed, only one position is skipped for each P1 and P2 interleaving buffers (in comparison of up to two positions may be skipped for S interleaving buffer by S fill engine for each LLR processed), when P1 position is either dummy or filler, while P2 is dummy. In case both P1 and P2 positions are not pruned positions, two LLRs are consumed to fill in the two interleaving buffers, as depicted by the "Proc. 2 LLR" state in FIG. 13. If only one of the P1 or P2 position is a pruned position, only one LLR of the two is consumed to fill in the corresponding P1 or P2 buffers, and the other LLR will be left to be processed in the next cycle. This is depicted by the "Proc. 1 LLR" state in FIG. 13.

Figure 14:
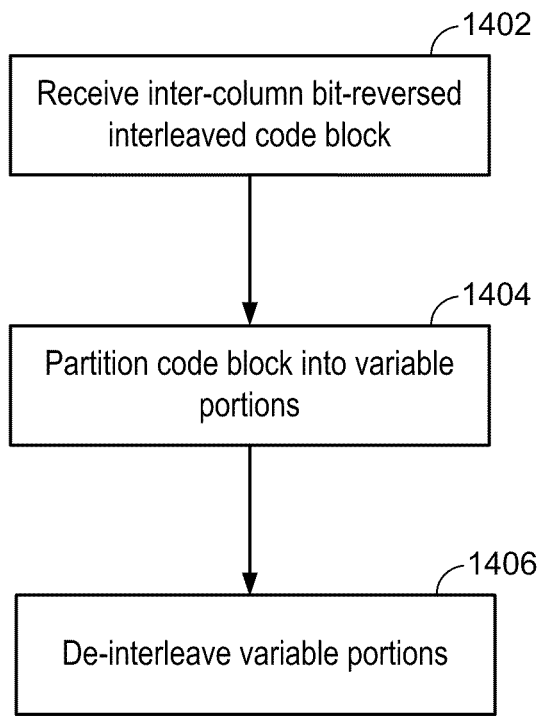
FIG. 14 is a block diagram illustrating de-interleaving according to one aspect of the present disclosure.

FIG. 14 is a diagram illustrating de-interleaving according to one aspect of the present disclosure. As shown in block 1402, an inter-column bit-reversed interleaved code block is received. As shown in block 1404, the received inter-column bit-reversed interleaved code block is portioned into variable portions. The partitioning enables de-interleaving of each portion independently from other portions. As shown in block 1406, the variable portions are de-interleaved.

In one configuration, an apparatus is configured for wireless communication including means for means for receiving an inter-column bit-reversed interleaved code block, means for partitioning the received inter-column bit-reversed interleaved code block into variable portions, and means for de-interleaving the variable portions. In one aspect, the aforementioned means may be receive processor 438, receive processor 458, S Fill Engine 1000, and P1P2 Fill Engine 1100. In another aspect, the aforementioned means may be a module or any apparatus configured to perform the functions recited by the aforementioned means.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A method for wireless communication, comprising:
  receiving an inter-column bit-reversed interleaved code block;
  partitioning the received inter-column bit-reversed interleaved code block into a first portion and a second portion, the partitioning enabling de-interleaving of each portion independently from other portions in a first direction and a second direction, the second direction being opposite from the first direction; and
  de-interleaving each of the first portion and the second portion independently from other portions, wherein each of the first portion and the second portion is de-interleaved in the first direction and is simultaneously de-interleaved in the second direction.

2. The method of claim 1, wherein the first portion comprises one third of the received inter-column bit-reversed interleaved code block and the second portion comprises two thirds of the received inter-column bit-reversed interleaved code block.

3. The method of claim 2, wherein the first portion comprises a Systematic data portion and the second portion comprises an interlaced Parity 1/Parity 2 portion.

4. The method of claim 1, wherein the partitioning further comprises partitioning the first portion into an even number of equal sized subportions and partitioning the second portion into an even number of equal sized subportions.

5. The method of claim 4, wherein the even number is two or four.

6. The method of claim 4, wherein the de-interleaving comprises de-interleaving the subportions independently of each other.

7. An apparatus for wireless communication, the apparatus comprising:
  means for receiving an inter-column bit-reversed interleaved code block;
  means for partitioning the received inter-column bit-reversed interleaved code block into a first portion and a second portion, the partitioning enabling de-interleaving of each portion independently from other portions in a first direction and a second direction, the second direction being opposite from the first direction; and
  means for de-interleaving each of the first portion and the second portion independently from other portions, wherein each of the first portion and the second portion is de-interleaved in the first direction and is simultaneously de-interleaved in the second direction.

8. The apparatus of claim 7, wherein the first portion comprises one third of the received inter-column bit-reversed interleaved code block and the second portion comprises two thirds of the received inter-column bit-reversed interleaved code block.

9. The apparatus of claim 8, wherein the first portion comprises a Systematic data portion and the second portion comprises an interlaced Parity 1/Parity 2 portion.

10. The apparatus of claim 7, wherein the means for partitioning further comprises means for partitioning the first portion into an even number of equal sized subportions and partitioning the second portion into an even number of equal sized subportions.

11. The apparatus of claim 10, wherein the means for de-interleaving further comprises means for de-interleaving the subportions independently of each other.

12. A computer program product for wireless communication, the computer program product comprising:
a non-transitory computer-readable medium having non-transitory program code recorded thereon, the program code comprising:
program code to receive an inter-column bit-reversed interleaved code block;
program code to partition the received inter-column bit-reversed interleaved code block into a first portion and a second portion, the partitioning enabling de-interleaving of each portion independently from other portion in a first direction and a second direction, the second direction being opposite from the first direction; and
program code to de-interleave each of the first portion and the second portion independently from other portions, wherein each of the first portion and the second portion is de-interleaved in the first direction and is simultaneously de-interleaved in the second direction.

13. An apparatus for wireless communication, the apparatus comprising:
a memory; and
at least one processor coupled to the memory, the at least one processor being configured:
to receive an inter-column bit-reversed interleaved code block;
to partition the received inter-column bit-reversed interleaved code block into a first portion and a second portion, the partitioning enabling de-interleaving of each portion independently from other portions in a first direction and a second direction, the second direction being opposite from the first direction; and
to de-interleave each of the first portion and the second portion independently from other portions, wherein each of the first portion and the second portion is de-interleaved in the first direction and is simultaneously de-interleaved in the second direction.

14. The apparatus of claim 13, wherein the first portion comprises one third of the received inter-column bit-reversed interleaved code block and the second portion comprises two thirds of the received inter-column bit-reversed interleaved code block.

15. The apparatus of claim 14, wherein the first portion comprises a Systematic data portion and the second portion comprises an interlaced Parity 1/Parity 2 portion.

16. The apparatus of claim 13, wherein the at least one processor configured to partition further comprises the at least one processor configured to partition the first portion into an even number of equal sized subportions and partition the second portion into an even number of equal sized subportions.

17. The apparatus of claim 16, wherein the even number is two or four.

18. The apparatus of claim 16, wherein the at least one processor is further configured to de-interleave the subportions independently of each other.

* * * * *